(12) United States Patent
Li

(10) Patent No.: US 11,793,038 B2
(45) Date of Patent: Oct. 17, 2023

(54) DISPLAY PANEL, HAVING DISCONTINUOUS COMMON LIGHT-EMITTING FUNCTIONAL LAYER, METHOD FOR MANUFACTURING A DISPLAY PANEL, AND DISPLAY DEVICE

(71) Applicant: Wuhan Tianma Micro-Electronics Co., Ltd., Wuhan (CN)

(72) Inventor: Lei Li, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 3 days.

(21) Appl. No.: 17/354,416

(22) Filed: Jun. 22, 2021

(65) Prior Publication Data
US 2021/0313407 A1    Oct. 7, 2021

(30) Foreign Application Priority Data

Dec. 1, 2020  (CN) .......................... 202011399271.0

(51) Int. Cl.
| | |
|---|---|
| *H10K 59/124* | (2023.01) |
| *H10K 50/844* | (2023.01) |
| *H10K 71/00* | (2023.01) |
| *H10K 50/11* | (2023.01) |
| *H10K 50/15* | (2023.01) |

(Continued)

(52) U.S. Cl.
CPC ......... *H10K 59/124* (2023.02); *H10K 50/844* (2023.02); *H10K 71/00* (2023.02); *H10K 50/11* (2023.02); *H10K 50/15* (2023.02); *H10K 50/16* (2023.02); *H10K 50/17* (2023.02);

(Continued)

(58) Field of Classification Search
CPC ................................................... H10K 59/124
See application file for complete search history.

(56) References Cited

U.S. PATENT DOCUMENTS

| | | | |
|---|---|---|---|
| 2017/0110532 A1* | 4/2017 | Kim | ................. H01L 51/5256 |
| 2017/0148856 A1* | 5/2017 | Choi | ................. H01L 27/3258 |

(Continued)

FOREIGN PATENT DOCUMENTS

| | | |
|---|---|---|
| CN | 110828519 A | 2/2020 |
| CN | 110896092 A | 3/2020 |
| CN | 111463242 A | 7/2020 |

OTHER PUBLICATIONS

Chinese Office Action related to Application No. 202011399271.0; dated Apr. 15, 2022.

*Primary Examiner* — Caleb E Henry
(74) *Attorney, Agent, or Firm* — von Briesen & Roper, s.c.

(57) ABSTRACT

Provided are a display panel, a method for manufacturing a display panel, and a display device. The display panel includes: a base substrate; an insulating layer disposed on the base substrate; a first groove provided in a transition region, a first cover layer and a common light-emitting functional layer. The first groove at least partially surrounds a display region. The first groove includes a first portion and a second portion. An aperture of the second portion on a side adjacent to the first portion is less than an aperture of the first portion on a side adjacent to the second portion. The first cover layer includes a first sub-cover layer disposed on the side of the insulating layer away from the base substrate and a second sub-cover layer. The second sub-cover layer covers a sidewall of the second portion. The common light-emitting functional layer is disconnected at the first groove.

19 Claims, 12 Drawing Sheets

(51) Int. Cl.
  *H10K 50/16* (2023.01)
  *H10K 50/17* (2023.01)
  *H10K 50/822* (2023.01)
  *H10K 59/123* (2023.01)
  *H10K 59/12* (2023.01)

(52) U.S. Cl.
  CPC ......... *H10K 50/171* (2023.02); *H10K 50/822* (2023.02); *H10K 59/1201* (2023.02); *H10K 59/123* (2023.02)

(56) References Cited

U.S. PATENT DOCUMENTS

| | | | |
|---|---|---|---|
| 2017/0162637 A1* | 6/2017 | Choi | H01L 27/3276 |
| 2018/0151834 A1* | 5/2018 | Kanaya | H01L 51/504 |
| 2018/0159075 A1* | 6/2018 | Kim | H01L 27/1248 |
| 2019/0334120 A1* | 10/2019 | Seo | G06F 3/0444 |
| 2020/0020752 A1* | 1/2020 | Shi | H04M 1/0266 |
| 2020/0064968 A1* | 2/2020 | Kim | G06F 3/0445 |
| 2020/0075692 A1* | 3/2020 | Park | H01L 27/3244 |
| 2020/0106046 A1* | 4/2020 | Kim | H01L 27/326 |
| 2020/0106057 A1* | 4/2020 | Yoo | G09G 3/3225 |
| 2020/0152842 A1* | 5/2020 | Park | H01L 27/15 |
| 2020/0168683 A1* | 5/2020 | Son | H01L 27/3258 |
| 2020/0176520 A1* | 6/2020 | Kim | H01L 51/5253 |
| 2020/0176708 A1* | 6/2020 | Kanaya | H01L 51/5237 |
| 2020/0194714 A1* | 6/2020 | Won | H01L 27/3248 |
| 2020/0194721 A1* | 6/2020 | Lee | G06F 3/0412 |
| 2020/0212139 A1* | 7/2020 | Baek | H10K 50/11 |
| 2022/0123081 A1* | 4/2022 | Park | H10K 59/123 |
| 2022/0149323 A1* | 5/2022 | Kim | H10K 50/844 |

\* cited by examiner

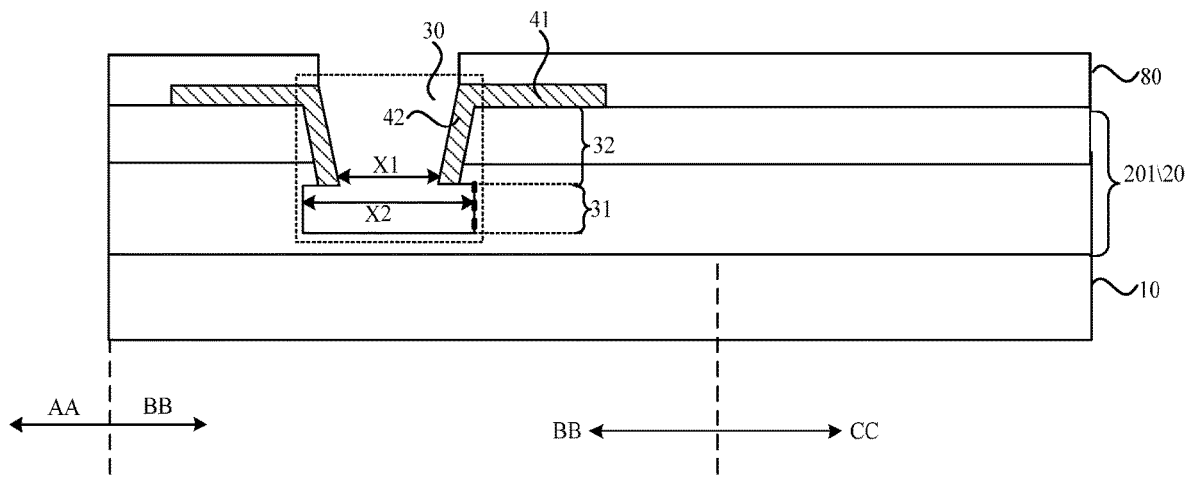
FIG. 16
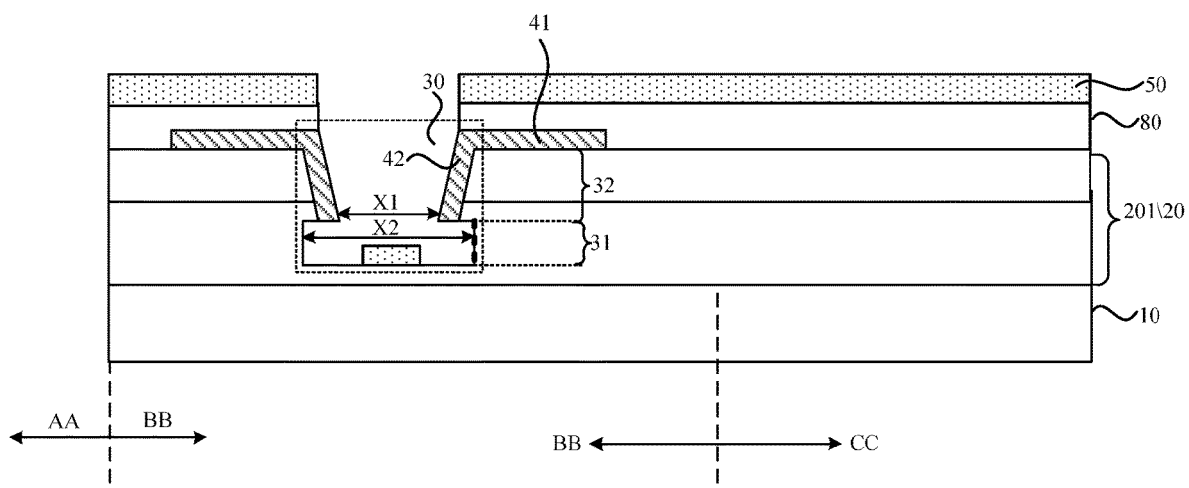
FIG. 17
| Form a second cover layer at the bottom of the third groove | S210 |
| Form a second insulating layer on the side of the first insulating layer facing away from the base substrate | S220 |
| Remove the second insulating layer at the third groove to form a second groove | S230 |
FIG. 18

DISPLAY PANEL, HAVING DISCONTINUOUS COMMON LIGHT-EMITTING FUNCTIONAL LAYER, METHOD FOR MANUFACTURING A DISPLAY PANEL, AND DISPLAY DEVICE

CROSS-REFERENCE TO RELATED APPLICATION

This application claims priority to Chinese Patent Application No. 202011399271.0 filed Dec. 1, 2020, the disclosure of which is incorporated herein by reference in its entirety.

TECHNICAL FIELD

The present disclosure relates to the field of display technologies and, in particular, to a display panel, a method for manufacturing a display panel, and a display device.

BACKGROUND

A full screen is to be mainly developed in organic light-emitting diode (OLED) display technologies. The full screen is a panel architecture designed with ultra-narrow bezels around and with a camera placed in a hole dug in a display region. The full screen is the panel architecture with the highest screen-to-body ratio in a panel.

The technology of the camera under a screen in the related art mainly involves two structures of a through hole and a blind hole. In the through hole design, the substrate in the camera region is required to be hollowed out to form the through hole. The through hole will lead to the display region being easily eroded by water and oxygen, and especially the water vapor will enter the interior of the display panel along a common light-emitting functional layer. Thus, the reliability is poor.

SUMMARY

A display panel, a method for manufacturing a display panel, and a display device are provided in embodiments of the present disclosure, so as to solve the following issue in the related art: when a through hole is designed in an opening region, a display region is easily eroded by water and oxygen since the through hole is formed on the substrate in the opening region, and thus the reliability of a product is affected.

In a first aspect, a display panel is provided in an embodiment of the present disclosure and includes an opening region, a transition region, and a display region, where the display region at least partially surrounds the opening region, and the transition region is disposed between the display region and the opening region; and the display panel includes a base substrate, an insulating layer disposed on the base substrate, a first groove provided in the transition region, a first cover layer, and a common light-emitting functional layer.

The first groove at least partially surrounds the display region; in a direction perpendicular to and away from the base substrate, the first groove includes a first portion and a second portion which are in communication with each other; and the first groove penetrates at least part of the insulating layer and has the second portion disposed on a side of the first portion away from the base substrate, and an aperture of the second portion on a side adjacent to the first portion is less than an aperture of the first portion on a side adjacent to the second portion.

The first cover layer is disposed on a side of the insulating layer facing away from the base substrate; and the first cover layer includes a first sub-cover layer and a second sub-cover layer, the first sub-cover layer is disposed on the side of the insulating layer facing away from the base substrate, and the second sub-cover layer covers a sidewall of the second portion.

The common light-emitting functional layer is disposed on a side of the first cover layer facing away from the base substrate and is disconnected at the first groove.

In a second aspect, a method for manufacturing a display panel is provided in an embodiment of the present disclosure. The method includes steps described below.

A first insulating layer is formed on a base substrate, where the base substrate includes a reserved opening region, a transition region, and a display region, the display region at least partially surrounds the reserved opening region, and the transition region is disposed between the display region and the reserved opening region.

At least one third groove is formed in the transition region, each of the at least one third groove at least partially surrounding the display region.

A first cover layer is formed on a side of the first insulating layer facing away from the base substrate, where the first cover layer covers part of an upper surface of the first insulating layer in the transition region and part of a sidewall of each of the at least one third groove.

A passivation layer is formed on a side of the first cover layer facing away from the base substrate.

The passivation layer at each of the at least one third groove is removed to form a first groove, where in a direction perpendicular to and away from the base substrate, the first groove includes a first portion and a second portion which are in communication with each other; the first groove penetrates at least part of the first insulating layer and has the second portion disposed on a side of the first portion away from the base substrate, and an aperture of the second portion on a side adjacent to the first portion is less than an aperture of the first portion on a side adjacent to the second portion; and the first cover layer includes a first sub-cover layer and a second sub-cover layer, the first sub-cover layer is disposed on the side of the first insulating layer facing away from the base substrate, and the second sub-cover layer covers a sidewall of the second portion.

A common light-emitting functional layer is formed on a side of the passivation layer facing away from the base substrate, where the common light-emitting functional layer is disconnected at the first groove.

In a third aspect, a display device is provided in an embodiment of the present disclosure and includes any display panel described in the first aspect.

BRIEF DESCRIPTION OF DRAWINGS

FIG. 16 is a sectional view in another process for manufacturing a display panel according to an embodiment of the present disclosure;

FIG. 17 is a sectional view in another process for manufacturing a display panel according to an embodiment of the present disclosure;

FIG. 18 is a flowchart of another method for manufacturing a display panel according to an embodiment of the present disclosure;

DETAILED DESCRIPTION

Figure 1:
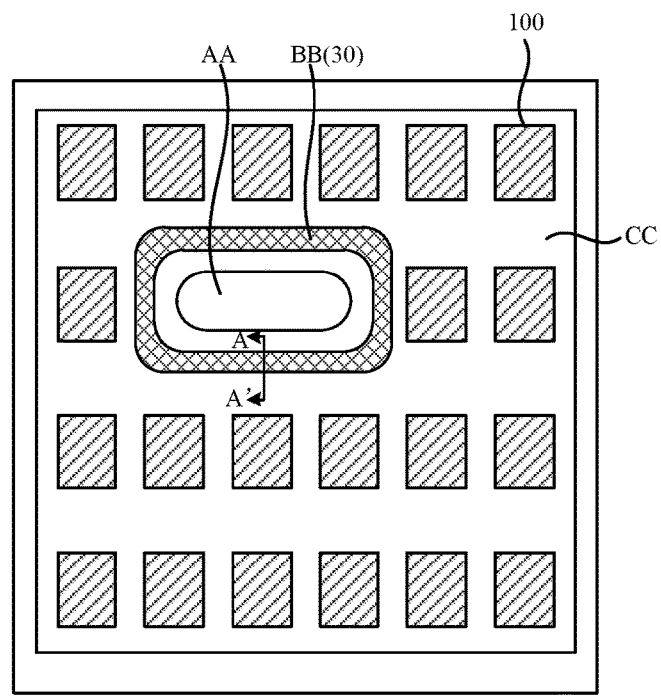
FIG. 1 is a structural diagram of a display panel according to an embodiment of the present disclosure.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Figure 2:
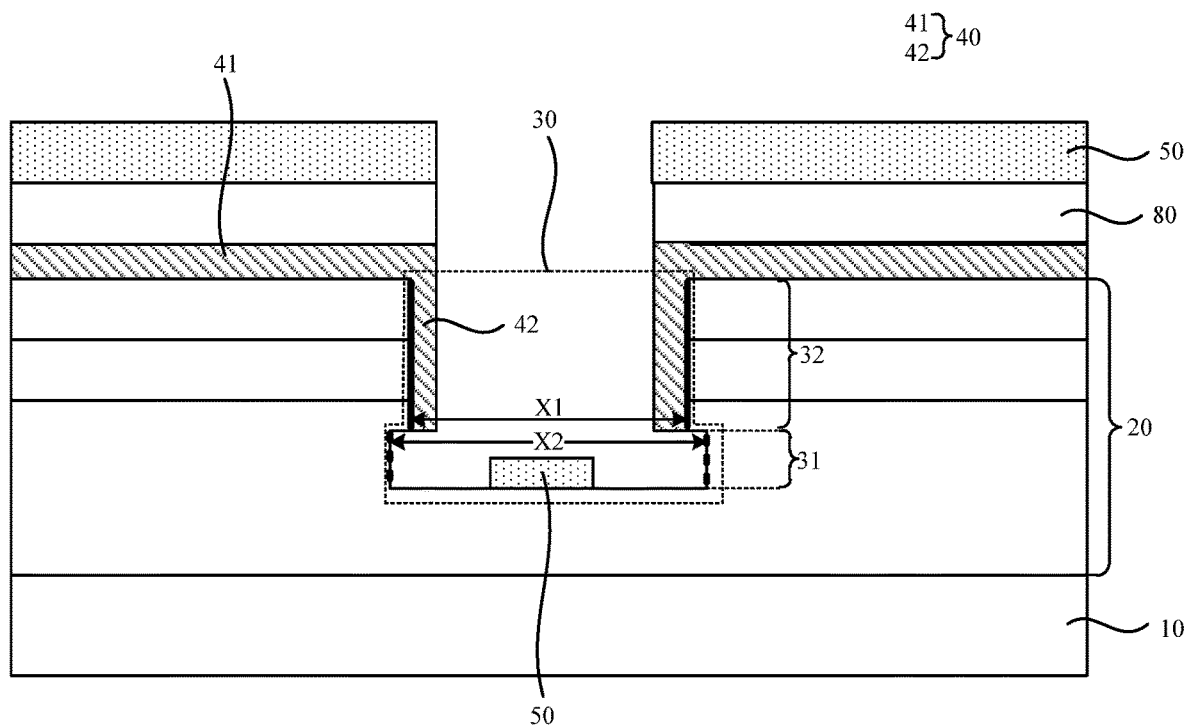
FIG. 2 is a sectional view of the display panel of FIG. 1 taken along section A-A'.

FIG. 1 is a structural diagram of a display panel according to an embodiment of the present disclosure, and FIG. 2 is a sectional view of the display panel of FIG. 1 taken along section A-A'. As shown in FIG. 1 and FIG. 2, the display panel includes an opening region AA, a transition region BB, and a display region CC. The display region CC at least partially surrounds the opening region AA, and the transition region BB is disposed between the display region and the opening region. The display panel further includes a base substrate 10, an insulating layer 20 disposed on the base substrate 10, and a first groove 30 provided in the transition region BB, a first cover layer 40, and a common light-emitting functional layer 50. The first groove 30 at least partially surrounds the display region CC. In a direction perpendicular to and away from the base substrate 10, the first groove 30 includes a first portion 31 and a second portion 32 which are in communication with each other. The first groove 30 penetrates at least part of the insulating layer 20 and has the second portion 32 disposed on a side of the first portion 31 away from the base substrate 10. An aperture X1 of the second portion 32 on a side adjacent to the first portion 31 is less than an aperture X2 of the first portion 31 on a side adjacent to the second portion 32. The first cover layer 40 includes a first sub-cover layer 41 and a second sub-cover layer 42, the first sub-cover layer 41 is disposed on a side of the insulating layer 20 facing away from the base substrate 10, and the second sub-cover layer 42 covers sidewalls of the second portion 32. The common light-emitting functional layer 50 is disposed on a side of the first cover layer 40 facing away from the base substrate 10 and is disconnected at the first groove 30 and is discontinuous.

Exemplarily, as shown in FIG. 1, the display panel includes the display region CC, the transition region BB, and the opening region AA. The display region CC of the display panel is provided with light-emitting pixels 100 to implement display of the display panel. The opening region AA of the display panel may be provided with a photosensitive element to implement under-screen shooting or provided with other elements to implement multi-functionality of the display panel. FIG. 1 exemplarily shows that the display region CC surrounds the opening region AA. When the opening region is located on one side edge of the display panel, the display region CC may partially surround the opening region AA. The transition region BB is located between the display region CC and the opening region AA. The transition region BB is provided with the first groove 30 used for separating the opening region AA and the display region CC, so that the display region CC of the display panel is prevented from being eroded by water and oxygen due to the opening of the opening region AA, and the reliability of a display product is thus improved.

In an embodiment, as shown in FIG. 2, the first groove 30 is provided in the transition region BB of the display panel, penetrates at least part of the insulating layer 20, and includes the first portion 31 and the second portion 32; the first sub-cover layer 41 of the first cover layer 40 is disposed on the side of the insulating layer 20 facing away from the base substrate 10, and the second sub-cover layer 42 of the first cover layer 40 covers the sidewalls of the second portion 32 of the first groove 30 (FIG. 2 exemplarily illustrates the sidewalls of the second portion in bold lines and the sidewalls of the first portion in bold dashed lines). The first cover layer 40 is formed on the side of the insulating layer 20 facing away from the base substrate 10, the second sub-cover layer 42 of the first cover layer 40 covers the sidewalls of the second portion 32 of the first groove 30, and the sidewalls of the first portion 31 of the first groove 30 not covered by the second sub-cover layer 42 may be further etched, so it is achieved that the aperture X1 of the second portion 32 of the first groove 30 on the side adjacent to the first portion 31 is less than the aperture X2 of the first portion 31 of the first groove 30 on the side adjacent to the second portion 32. When the common light-emitting functional layer 50 is formed on the side of the first cover layer 40 facing away from the base substrate 10 and when the common light-emitting functional layer 50 is formed by evaporation, part of the material of the common light-emitting functional layer 50 is formed by evaporation on the first sub-cover layer 41 of the first cover layer 40, part of the material of the common light-emitting functional layer 50 falls into the bottom of the first groove 30 and no common light-emitting functional layer 50 formed by evaporation exists on the sidewalls of the first groove 30 since the aperture X1 of the second portion 32 of the first groove 30 on the side adjacent to the first portion 31 is less than the aperture X2 of the first portion 31 of the first groove 30 on the side adjacent to the second portion 32 and the thickness of the common light-emitting functional layer 50 is limited. Therefore, the common light-emitting functional layer 50 located on the side of the first sub-cover layer facing away from the base substrate is disconnected from the common light-emitting functional layer 50 located at the bottom of the first groove 30, and thus the common light-emitting functional layer 50 is discontinuous in the transition region BB. That is, the common light-emitting functional layer 50 is discontinuous in the opening region AA and the display region CC, thus effectively preventing external water and oxygen from intruding into the interior of the display panel through the common light-emitting functional layer 50 in the opening region AA (the common light-emitting functional layer 50 includes an organic material layer which easily becomes a channel for water vapor and oxygen to intrude in), and preventing encapsulation failure caused by water and oxygen intruding into the display region CC. Meanwhile, the reliability of the product can be improved without additionally providing a mask, the process flow can be simplified, and the manufacturing cost can be saved.

It is to be noted that the base substrate 10 may include a glass material, a polymer material, or a metal material, and the base substrate 10 may be rigid or flexible. For example, the base substrate 10 may be a transparent glass substrate containing SiO2 as a main component, or a substrate including a polymer resin such as a reinforced plastic, for example, a polyimide substrate and a polyacrylic resin substrate. The specific materials and properties of the base substrate 10 are not limited in the embodiments of the present disclosure.

Exemplarily, the opening region AA is provided in the shape of a rectangle in FIG. 1. The opening region AA may also be provided in other shapes such as a circle, an ellipse, and a water droplet. The shape of the transition region BB located between the opening region AA and the display region CC is related to the shape of the opening region AA, and the specific shapes of the opening region AA and the transition region BB are not limited in the embodiments of the present disclosure.

According to the display panel provided in the embodiment of the present disclosure, the first groove is provided in the transition region of the display panel, penetrates at least part of the insulating layer, and includes the first portion and the second portion; and the first sub-cover layer of the first cover layer is disposed on the side of the insulating layer facing away from the base substrate, and the second sub-cover layer of the first cover layer covers the sidewall of the second portion of the first groove. The second sub-cover layer of the first cover layer formed on the side of the insulating layer facing away from the base substrate covers the sidewall of the second portion of the first groove, and the sidewall of the first portion of the first groove not covered by the second sub-cover layer may be etched in an inorganic insulating layer etching process. Therefore, it is achieved that the aperture of the second portion of the first groove on the side adjacent to the first portion is less than the aperture of the first portion of the first groove on the side adjacent to the second portion. When the common light-emitting functional layer is formed on the side of the first cover layer facing away from the base substrate, the common light-emitting functional layer located on the side of the first sub-cover layer facing away from the base substrate is disconnected from the common light-emitting functional layer located at the bottom of the first groove. Therefore, the common light-emitting functional layer is discontinuous in the transition region, thus effectively preventing the common light-emitting functional layer in the display region from being eroded by external water and oxygen, preventing encapsulation failure, and improving the display effect of the display panel.

Figure 3:
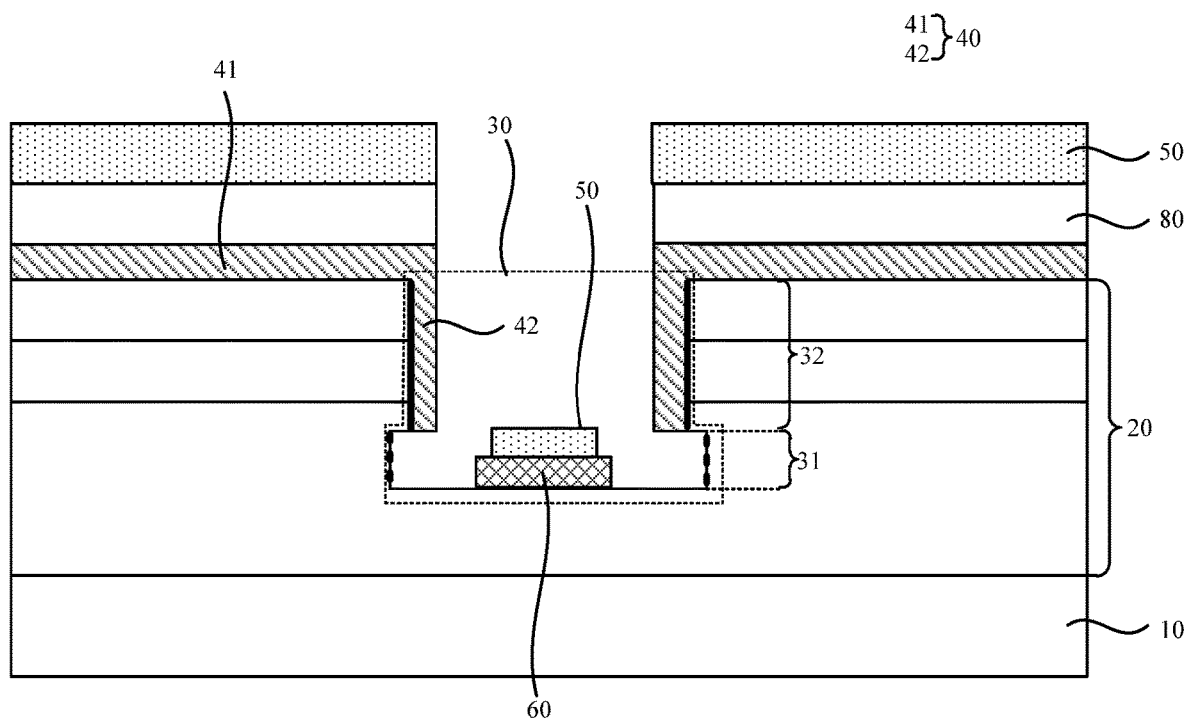
FIG. 3 is a sectional view of another display panel according to an embodiment of the present disclosure.

In an embodiment, on the basis of the preceding embodiment, FIG. 3 is a sectional view of another display panel according to an embodiment of the present disclosure. As shown in FIG. 3, the display panel further includes a second cover layer 60 disposed at the bottom of the first groove 30.

Exemplarily, as shown in FIG. 3, the second cover layer 60 is disposed at the bottom of the first groove 30, and the vertical projection of the second cover layer 60 on the base substrate 10 is within the vertical projection of the first portion 31 of the first groove 30 on the base substrate 10. Therefore, when the common light-emitting functional layer 50 is formed on the side of the first cover layer 40 facing away from the base substrate 10, the material of the common light-emitting functional layer 50 falling into the bottom of the first groove 30 is formed on the second cover layer 60. A height difference exists between the common light-emitting functional layer 50 formed on the second cover layer 60 and the bottom of the first groove, so if the common light-emitting functional layer located on the second cover layer is not completely disconnected, a height difference between the second cover layer 60 and the bottom of the first groove can be utilized to prevent the common light-emitting functional layer from climbing. Therefore, the common light-emitting functional layer formed on the second cover layer is completely disconnected from the common light-emitting functional layer located at the bottom of the first groove, the common light-emitting functional layer in the display region is further prevented from being eroded by external water and oxygen through the opening region, and the separation capability of the first groove is improved.

Figure 4:
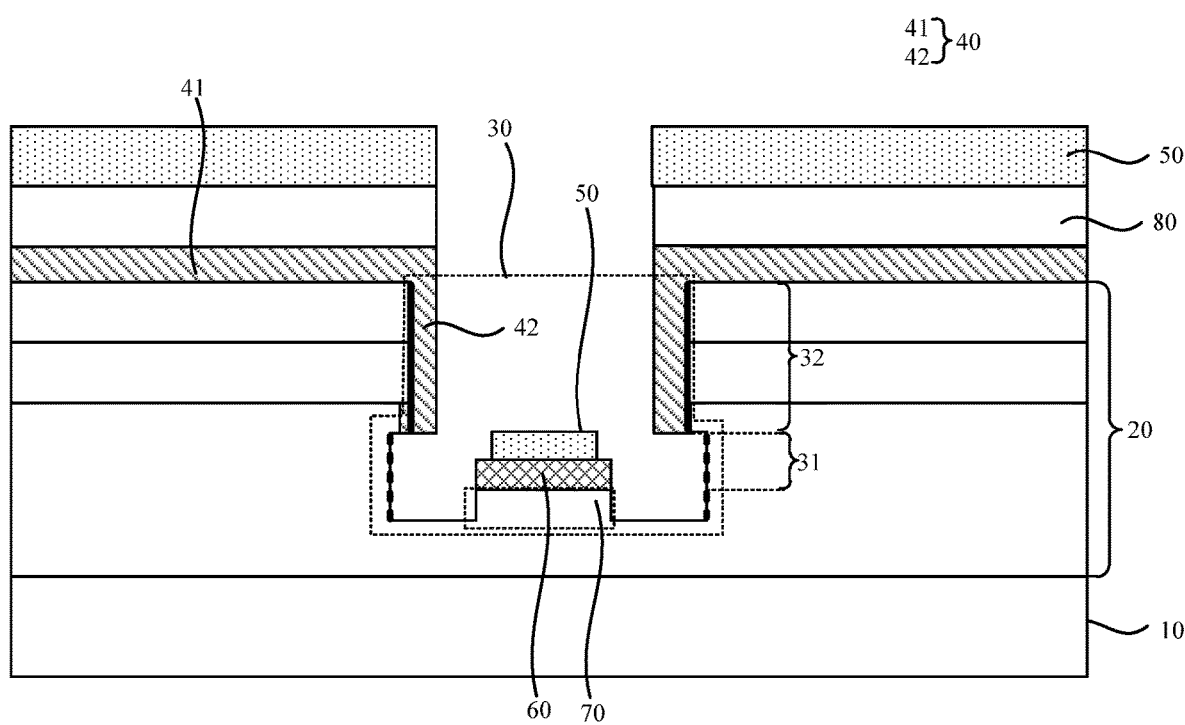
FIG. 4 is a sectional view of another display panel according to an embodiment of the present disclosure.

In an embodiment, on the basis of the preceding embodiments, FIG. 4 is a sectional view of another display panel according to an embodiment of the present disclosure. As shown in FIG. 4, a protrusion structure 70 is further provided at the bottom of the first groove 30 and covered by the second cover layer 60.

Exemplarily, as shown in FIG. 4, the protrusion structure 70 is disposed at the bottom of the first groove 30 and covered by the second cover layer 60. When the common light-emitting functional layer 50 is formed on the side of the first cover layer 40 facing away from the base substrate 10, the material of the common light-emitting functional layer 50 falling into the bottom of the first groove 30 is formed on the first cover layer 60. The protrusion structure 70 is provided so that the distance between the common light-emitting functional layer 50 formed on the second cover layer 60 and the bottom of the first groove 30 can be increased, thus preventing the common light-emitting functional layer 50 from climbing and further ensuring that the common light-emitting functional layer 50 is disconnected in the first groove 30.

Figure 5:
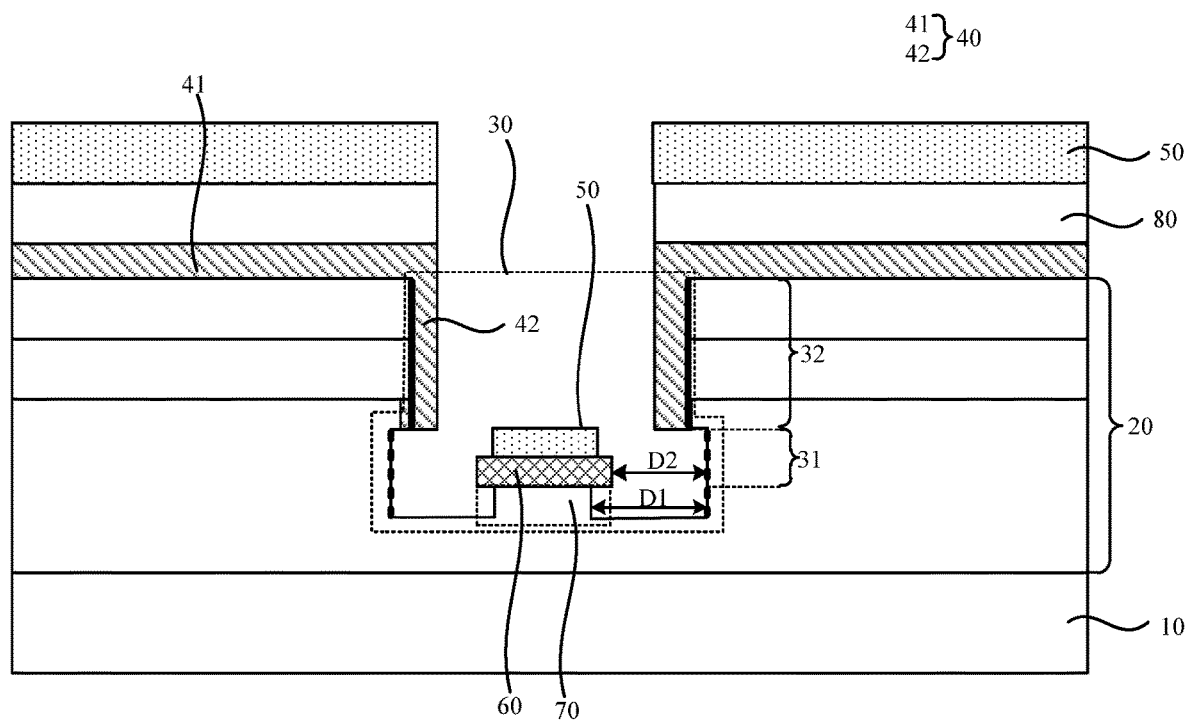
FIG. 5 is a sectional view of another display panel according to an embodiment of the present disclosure.

It is to be noted that in other implementations, as shown in FIG. 5, the distance between the sidewall of the first cover layer 60 and the sidewall of the first portion 31 of the first groove 30 is D2, the distance between the sidewall of the protrusion structure 70 and the sidewall of the first portion 31 of the first groove 30 is D1, and D1>D2. The second cover layer 60 is formed on the side of the protrusion structure 70 facing away from the base substrate, so that the protrusion structure 70 at the bottom of the first groove 30 is side-etched, further ensuring that the common light-emitting functional layer formed on the second cover layer is completely disconnected from the common light-emitting functional layer at the bottom of the first groove.

Figure 6:
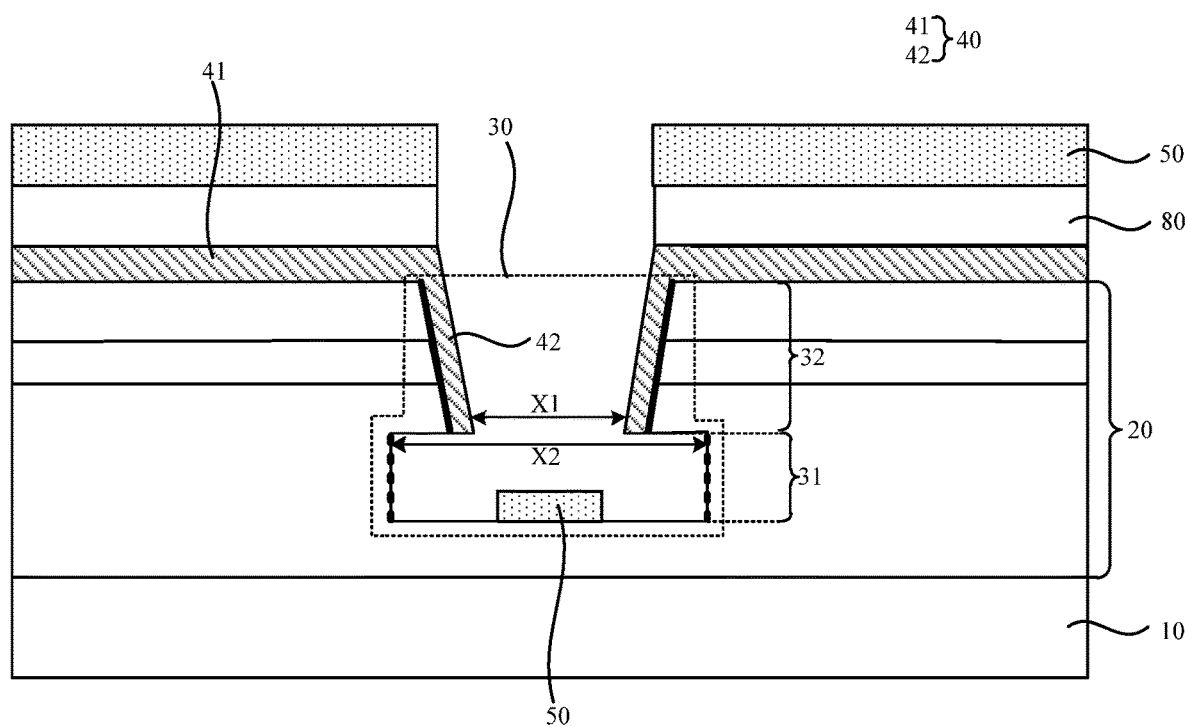
FIG. 6 is a sectional view of another display panel according to an embodiment of the present disclosure.

In an embodiment, on the basis of the preceding embodiments, FIG. 6 is a sectional view of another display panel according to an embodiment of the present disclosure. As shown in FIG. 6, the aperture of the second portion 32 of the first groove 30 gradually increases along the direction away from the base substrate 10.

As shown in FIG. 6, the aperture of the second portion 32 of the first groove 30 gradually increases along the direction away from the base substrate 10, so that it is ensured that when the first cover layer 40 is formed on the side of the insulating layer 20 facing away from the base substrate 10 by a sputtering process, the second sub-cover layer 42 of the first cover layer 40 can be formed on the sidewalls of the second portion 32 of the first groove 30. Therefore, the sidewalls of the second portion 32 of the first groove 30 covered by the second sub-cover layer 42 cannot be etched, while the sidewalls of the first portion 31 of the first groove 30 not covered by the second sub-cover layer 42 can be further etched. Thus, it is achieved that the aperture X1 of the second portion 32 of the first groove 30 on the side adjacent to the first portion 31 is less than the aperture X2 of the first portion 31 of the first groove 30 on the side adjacent to the second portion 32, and a good separation effect can be achieved.

In an embodiment, at least part of the first groove 30 is disposed at the base substrate 10, and the depth of the first groove 30 is less than a sum of the thickness of the insulating layer 20 and the thickness of the base substrate 10.

Figure 7:
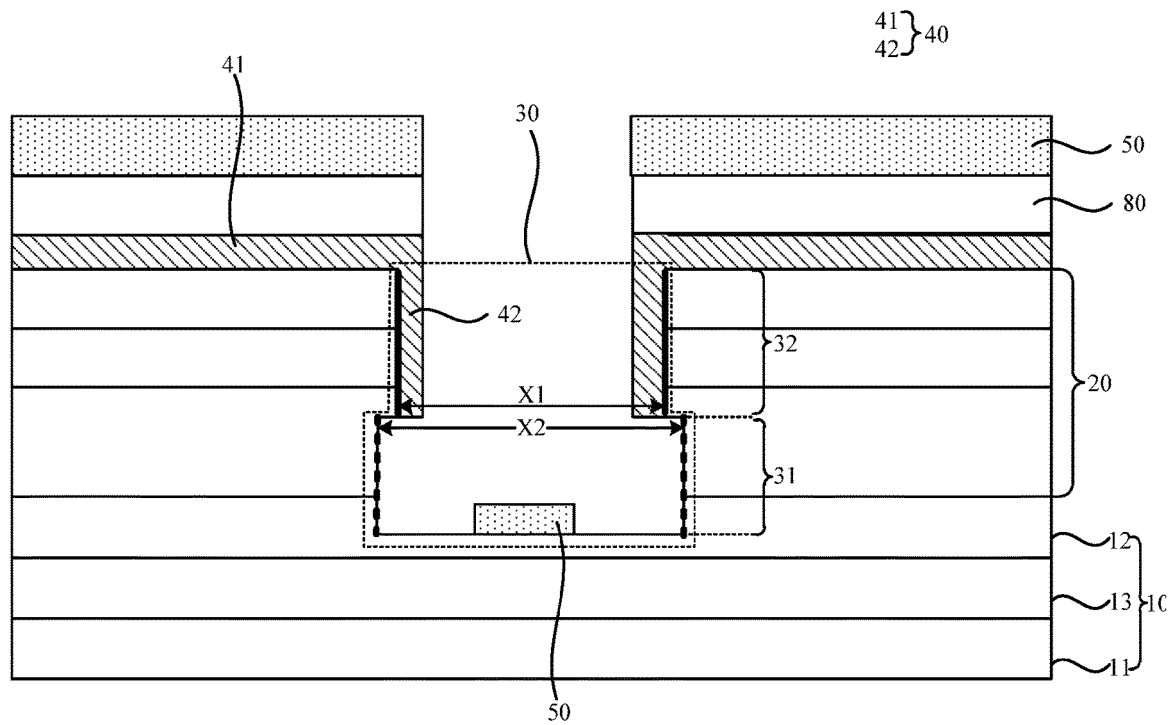
FIG. 7 is a sectional view of another display panel according to an embodiment of the present disclosure.

In the preceding embodiments, exemplarily, the base substrate 10 of the display panel includes the first substrate, and the first groove 30 penetrates part of the insulating layer 20. It may also be configured that the first groove 30 penetrates the insulating layer 20 and that at least part of the first groove 30 is disposed at the base substrate 10. Exemplarily, as shown in FIG. 7, the base substrate 10 of the display panel includes a lower substrate 11, an upper substrate 12, and a first buffer layer 13 disposed between the upper substrate 12 and the lower substrate 11; the first groove 30 penetrates the insulating layer 20 and at least part of the first groove 30 is disposed at the upper substrate 12. At least part of the first groove 30 is disposed at the base substrate 10 so that the first groove 30 is deeper in the direction perpendicular to the plane where the base substrate 10 is located, and it is further ensured that the common light-emitting functional layer 50 located on the side of the first cover layer 40 facing away from the base substrate 10 is disconnected from the common light-emitting functional layer 50 located at the bottom of the first groove 30. Thus, the common light-emitting functional layer 50 is discontinuous in the transition region BB, effectively preventing the common light-emitting functional layer 50 in the display region CC from being eroded by external water and oxygen. The first buffer layer 13 is disposed between the upper substrate 12 and the lower substrate 11, ensuring the overall flatness of the base substrate 10.

In an embodiment, the first cover layer 40 and the second cover layer 60 are disposed at a same layer.

Figure 8:
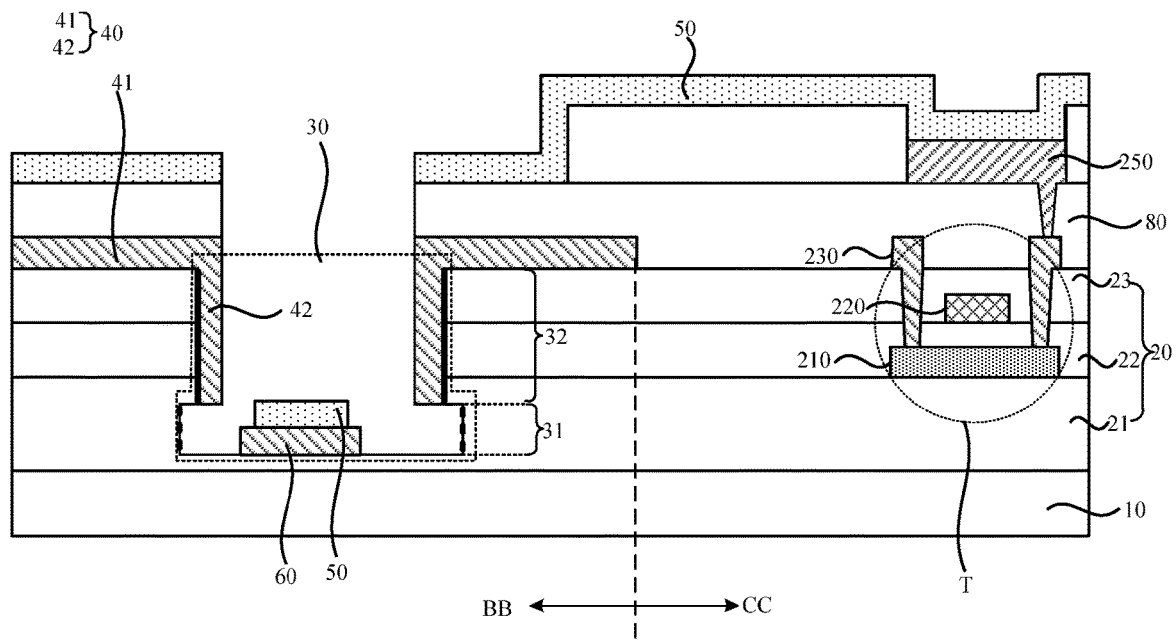
FIG. 8 is a sectional view of another display panel according to an embodiment of the present disclosure.

Exemplarily, as shown in FIG. 8, when the first cover layer 40 is formed by the sputtering process, the second cover layer 60 is also formed at the bottom of the first groove 30 by the sputtering process. The first cover layer 40 and the second cover layer 60 are disposed at the same layer, so that the first cover layer 40 and the second cover layer 60 can be formed in the same process, thus reducing the complexity of the manufacturing process for the display panel.

Figure 9:
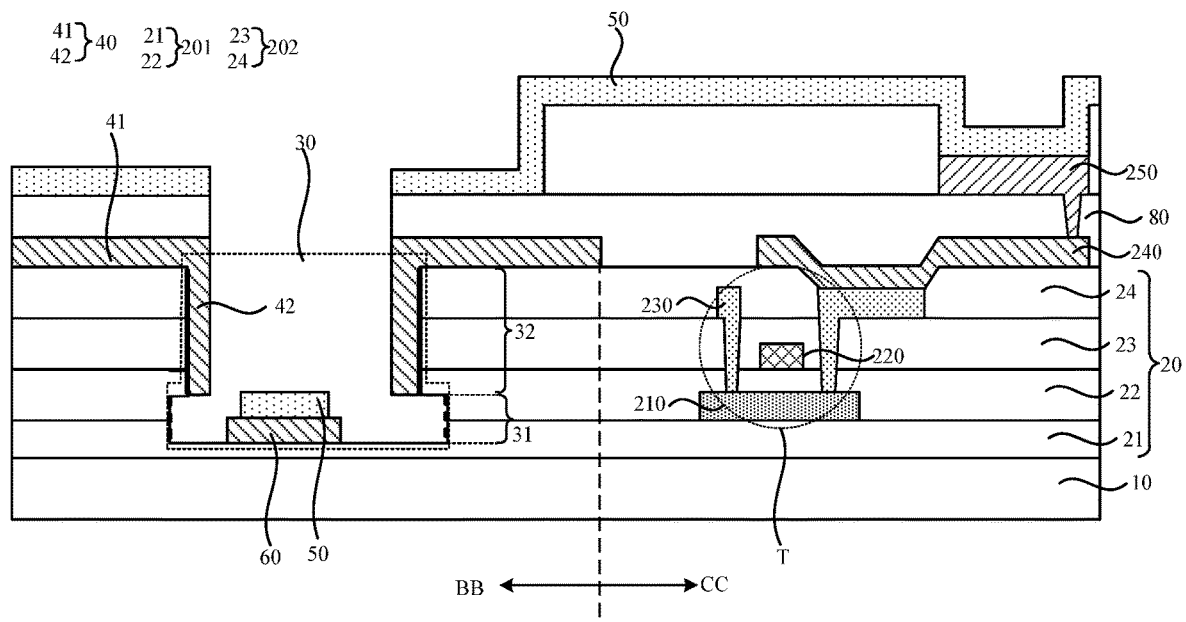
FIG. 9 is a sectional view of another display panel according to an embodiment of the present disclosure.

It is to be noted that FIG. 8 exemplarily illustrates that the first cover layer 40 and the second cover layer 60 are disposed at the same layer as a source or drain layer 230 of a thin-film transistor T in the display region CC. Alternatively, the first cover layer 40 and the second cover layer 60 may be disposed at the same layer as a first metal layer 240 in the display region CC, as shown in FIG. 9. The first cover layer 40 and the second cover layer 60 are formed in the transition region BB while the first metal layer 240 in the display region CC is formed, so that the first cover layer 40 and the second cover layer 60 in the transition region BB are formed in the same process as the first metal layer 240 in the display region CC, thus reducing the complexity of manufacturing the display panel. The first metal layer 240 is disposed on the side of the source or drain layer 230 facing away from the base substrate 10, and the first metal layer 240 is electrically connected to an anode metal layer 250 to reduce the resistance of the anode metal layer 250 and improve the conduction efficiency.

In an embodiment, the display panel further includes a cathode layer which may be electrically connected to a side of the first cover layer 40 adjacent to the display region to reduce the resistance of the cathode layer.

Figure 10:
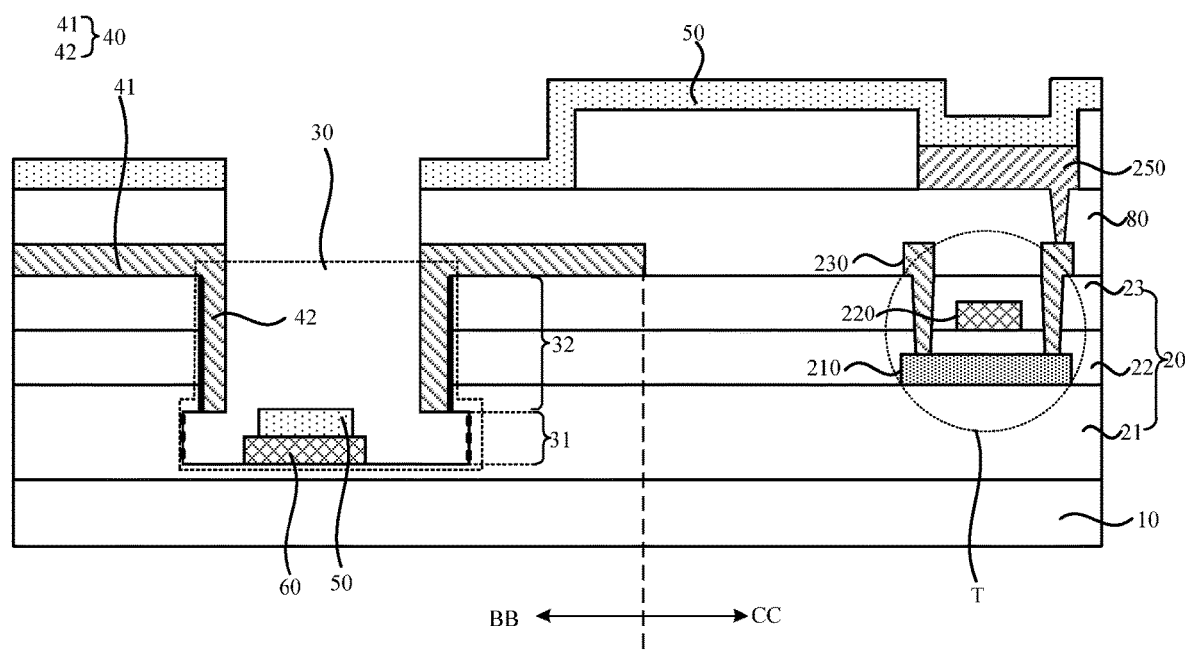
FIG. 10 is a sectional view of another display panel according to an embodiment of the present disclosure.

In an embodiment, the first cover layer 40 and the second cover layer 60 are disposed at different layers. The first cover layer 40 is disposed at the same layer as the source or drain layer 230 of the thin-film transistor T in the display region CC, and the second cover layer 60 is located at the same layer as a gate layer 220 of the thin-film transistor T in the display region CC, as shown in FIG. 10. Alternatively, the first cover layer 40 is disposed at the same layer as the source or drain layer 230 of the thin-film transistor T in the display region CC, the second cover layer 60 is disposed at the same layer as the first metal layer 240 in the display region CC, and the first metal layer 240 is disposed on the side of the source or drain layer 230 facing away from the base substrate 10, as shown in FIG. 11.

When the first cover layer 40 and the second cover layer 60 are disposed at different layers, the first cover layer 40 may be disposed at the same layer as the source or drain layer 230 of the thin-film transistor T in the display region CC, and the second cover layer 60 may be disposed at the same layer as the gate layer 220 of the thin-film transistor T in the display region CC, as shown in FIG. 10. Alternatively, the first cover layer 40 may be disposed at the same layer as the source or drain layer 230 of the thin-film transistor T in the display region CC, the second cover layer 60 may be disposed at the same layer as the first metal layer 240 in the display region CC, and the first metal layer 240 is disposed on the side of the source or drain layer 230 facing away from the base substrate 10, as shown in FIG. 11. When the first cover layer 40 and the second cover layer 60 are disposed at different layers, the second cover layer 60 may be formed in the transition region BB while the gate layer 220 in the display region is formed, and the first cover layer 40 may be formed in the transition region BB while the source or drain layer 230 in the display region is formed; or the first cover layer 40 is formed in the transition region BB while the source or drain layer 230 in the display region CC is formed, and the second cover layer 60 is formed in the transition region BB while the first metal layer 240 in the display region CC is formed, thereby reducing the process complexity of the display panel and improving the manufacturing efficiency.

In an embodiment, the insulating layer 20 includes a first insulating layer 201 and a second insulating layer 202, and the thin-film transistor T in the display region is of a top-gate structure; the first insulating layer 201 includes a buffer layer 21 and a first interlayer insulating layer 22, and the second insulating layer 202 includes a second interlayer insulating layer 23; and the buffer layer 21 is disposed between an active layer 210 of the thin-film transistor T and the base substrate 10, the first interlayer insulating layer 22 is disposed between the gate layer 220 of the thin-film transistor T and the active layer 210 of the thin-film transistor T, and the second interlayer insulating layer 23 is disposed between the gate layer 220 of the thin-film transistor T and the source or drain layer 230 of the thin-film transistor T.

Figure 11:
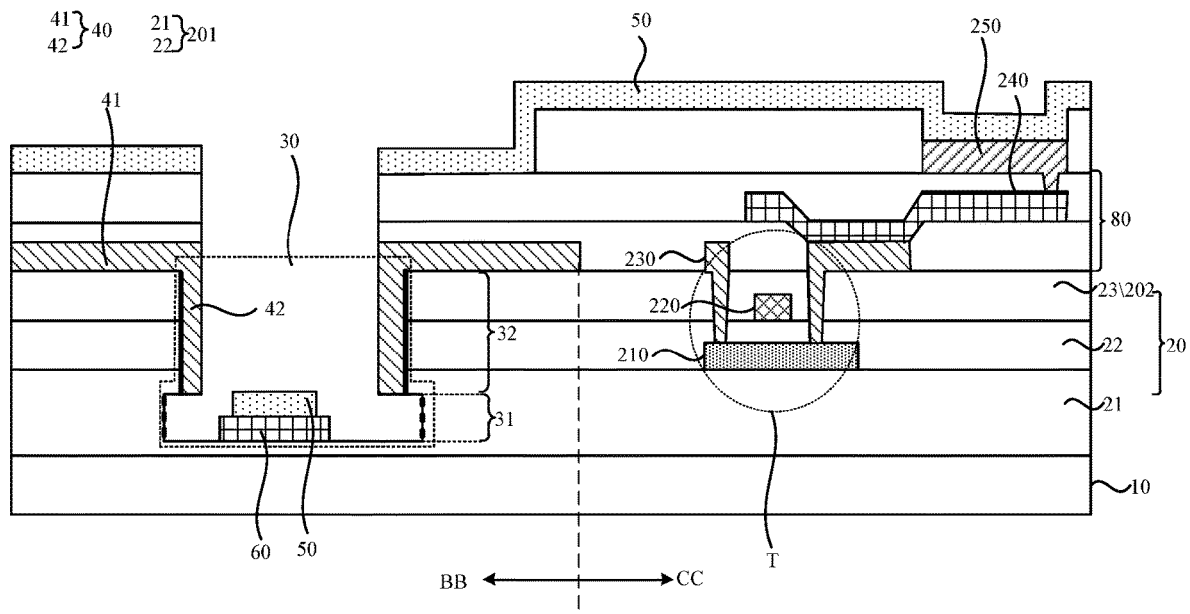
FIG. 11 is a sectional view of another display panel according to an embodiment of the present disclosure.

Exemplarily, as shown in FIG. 11, the thin-film transistor T in the display region CC is of the top-gate structure, the insulating layer 20 includes the first insulating layer 201 and the second insulating layer 202, the first insulating layer 201 includes the buffer layer 21 and the first interlayer insulating layer 22, the second insulating layer 202 includes the second interlayer insulating layer 23, and the buffer layer 21 is disposed between the active layer 210 of the thin-film transistor T and the base substrate 10. The buffer layer 21 is used for preventing impurities from penetrating into the thin-film transistor T, may include an inorganic insulating material such as silicon nitride or silicon oxide, and may have a single layer or a plurality of layers including the inorganic insulating material. The first interlayer insulating layer 22 is disposed between the gate layer 220 of the thin-film transistor T and the active layer 210 of the thin-film transistor T, and the gate of the thin-film transistor T and the active layer 210 of the thin-film transistor T can be insulated from each other by the first interlayer insulating layer 22. The second interlayer insulating layer 23 is disposed between the gate layer 220 of the thin-film transistor T and the source or drain layer 230 of the thin-film transistor T, and the gate of the thin-film transistor T and the source and drain of the thin-film transistor T can be insulated from each other by the second interlayer insulating layer 23.

It is to be noted that FIG. 11 exemplarily illustrates that the thin-film transistor T is of the top-gate structure. The thin-film transistor T may also be of a bottom-gate structure. When the thin-film transistor T is of the bottom-gate structure, the first insulating layer includes the buffer layer disposed between the gate layer of the thin-film transistor and the base substrate, the second insulating layer includes the first interlayer insulating layer and the second interlayer insulating layer, the first interlayer insulating layer is disposed between the gate layer of the thin-film transistor and the active layer of the thin-film transistor, and the second interlayer insulating layer is disposed between the active layer of the thin-film transistor and the source or drain layer of the thin-film transistor. The specific type of the thin-film transistor in the display region is not limited in the embodiments of the present disclosure.

Additionally, in other implementations, when the first cover layer 40 and the second cover layer 60 are disposed at the same layer as the first metal layer 240 in the display region CC and the thin-film transistor T in the display region CC is of the top-gate structure, the insulating layer 20 includes the first insulating layer 201 and the second insulating layer 202, the first insulating layer includes the buffer layer 21 and the first interlayer insulating layer 22, and the second insulating layer 202 includes the second interlayer insulating layer 23 and a third interlayer insulating layer 24. As shown in FIG. 9, the buffer layer 21 is disposed between the active layer 210 of the thin-film transistor T and the base substrate 10, the first interlayer insulating layer 22 is disposed between the gate layer 220 of the thin-film transistor T and the active layer 210 of the thin-film transistor T, the second interlayer insulating layer 23 is disposed between the gate layer 220 of the thin-film transistor T and the source or drain layer 230 of the thin-film transistor T, and the third interlayer insulating layer 24 is disposed between the source or drain layer 230 of the thin-film transistor T and the first metal layer 240.

Figure 12:
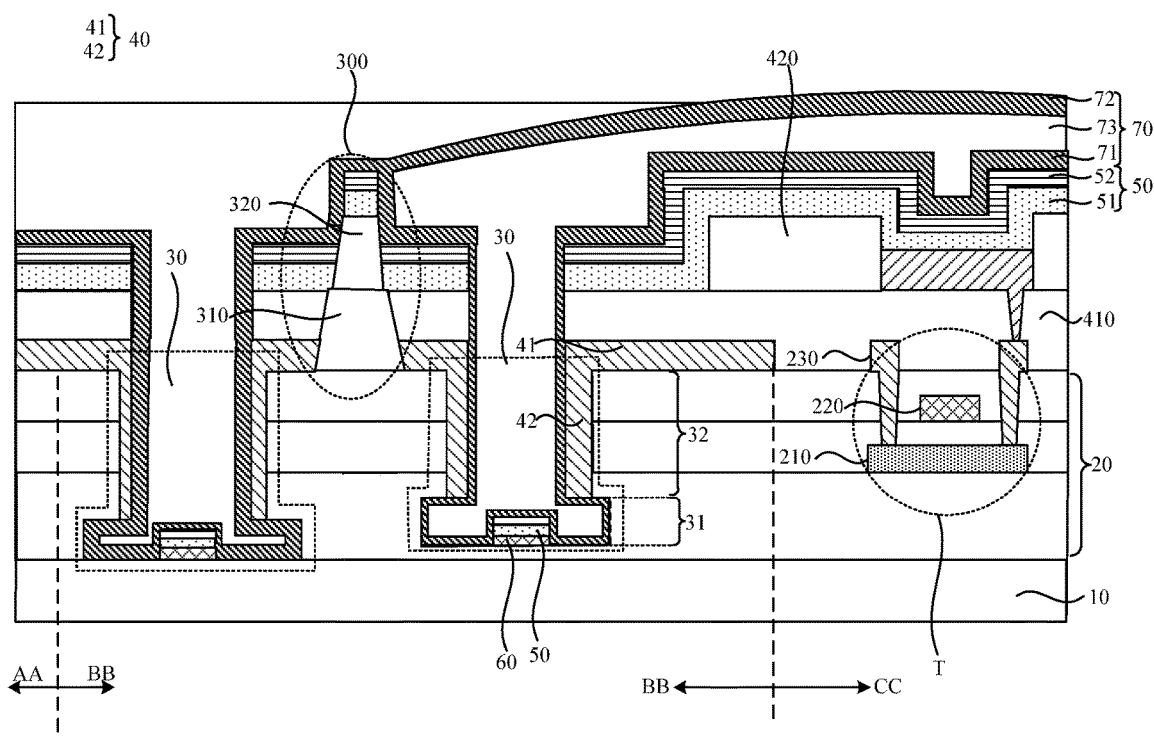
FIG. 12 is a sectional view of another display panel according to an embodiment of the present disclosure.

In an embodiment, on the basis of the preceding embodiments, FIG. 12 is a sectional view of another display panel according to an embodiment of the present disclosure. As shown in FIG. 12, the transition region BB of the display panel is further provided with at least one retaining wall structure 300, the retaining wall structure 300 at least partially surrounds the opening region AA and is disposed between a first groove 30 and the opening region AA; a plurality of first grooves 30 are provided in the transition region BB of the display panel, at least one first groove 30 is disposed between the retaining wall structure 300 and the display region CC, and at least one first groove 30 is disposed between the retaining wall structure 300 and the opening region AA.

Exemplarily, as shown in FIG. 12, the transition region BB of the display panel is further provided with at least one retaining wall structure 300, and the retaining wall structure 300 may include an organic insulating material and has an annular shape for surrounding the opening region AA. The retaining wall structure 300 may include a first sub-retaining wall structure 310 and a second sub-retaining wall structure 320. The first sub-retaining wall structure 310 may be formed in the same process as a planarized insulating layer 410 in the display region CC. The second sub-retaining wall structure 320 may be formed in the same process as a pixel defining layer 420 in the display region CC. The retaining wall structure 300 may prevent the flow of an organic encapsulation layer 73 during the process of forming the organic encapsulation layer 73.

Additionally, at least one first groove 30 may be disposed between the retaining wall structure 300 and the opening region AA to further prevent the display region CC of the display panel from being eroded by water and oxygen due to the opening of the opening region AA.

It is to be noted that in FIG. 12, the first groove 30 disposed between the retaining wall structure 300 and the display region CC penetrates part of the insulating layer 20, and the first groove 30 disposed between the retaining wall structure 300 and the opening region AA penetrates the insulating layer 20. Alternatively, it may be configured that the first groove 30 disposed between the retaining wall structure 300 and the display region CC penetrates the insulating layer 20 and that the first groove 30 disposed between the retaining wall structure 300 and the opening region AA penetrates part of the insulating layer 20. Alternatively, the first groove 30 disposed between the retaining wall structure 300 and the display region CC penetrates part of the insulating layer 20, and the first groove 30 disposed between the retaining wall structure 300 and the opening region AA penetrates part of the insulating layer 20. Alternatively, the first groove 30 disposed between the retaining wall structure 300 and the display region CC penetrates the insulating layer 20, and the first groove 30 disposed between the retaining wall structure 300 and the opening region AA penetrates the insulating layer 20. The specific depth of the first groove 30 disposed between the retaining wall structure 300 and the display region CC and the specific depth of the first groove 30 disposed between the retaining wall structure 300 and the opening region AA are not limited in the embodiments of the present disclosure.

Exemplarily, in FIG. 12, one first groove 30 is provided between the retaining wall structure 300 and the display region CC, and one first groove 30 is provided between the retaining wall structure 300 and the opening region AA. Alternatively, a plurality of first grooves 30 may be provided between the retaining wall structure 300 and the display region CC, and a plurality of first grooves 30 may be provided between the retaining wall structure 300 and the opening region AA. The number of first grooves is not limited in the embodiments of the present disclosure.

In an embodiment, the common light-emitting functional layer 50 includes at least one of: a hole auxiliary layer, an electron auxiliary layer, a light-emitting material layer, or a cathode layer. The light transmittance of a cathode material is low and such low light transmittance will affect the ambient light received by the photosensitive element corresponding to the opening region AA, so it is necessary to disconnect the cathode layer at the corresponding position of the opening region AA. However, the cathode layer is difficult to be removed by etching due to the selection of cathode layer materials, so the first groove structure can be used for disconnecting the cathode layer and thus the light transmittance of the opening region AA can be improved.

Exemplarily, with continued reference to FIG. 12, the common light-emitting functional layer 50 includes a light-emitting material layer 51 and a cathode layer 52, where the light-emitting material layer includes a low molecular weight or high molecular weight organic material that can emit light of a particular color. In other implementations, the common light-emitting functional layer 50 includes the hole auxiliary layer, the light-emitting material layer, the electron auxiliary layer, and the cathode layer which are sequentially stacked, where the hole auxiliary layer includes a hole transport layer and/or a hole injection layer, and the electron auxiliary layer includes an electron transport layer and/or an electron injection layer.

In an embodiment, the display panel further includes an encapsulation layer, an encapsulation layer 70 is located on the side of the common light-emitting functional layer 50 facing away from the base substrate 10 and fills the first groove 30, and the encapsulation layer 70 includes at least one inorganic encapsulation layer and at least one organic encapsulation layer which are stacked.

Exemplarily, with continued reference to FIG. 12, the encapsulation layer 70 is disposed on the side of the common light-emitting functional layer 50 facing away from the base substrate 10 and fills the first groove 30. The encapsulation layer 70 is disposed on the side of the common light-emitting functional layer 50 facing away from the base substrate 10 and is used for filling the first groove 30, so that the common light-emitting functional layer in the display region CC can be effectively prevented from being eroded by external water and oxygen.

It is to be noted that FIG. 12 exemplarily illustrates that the encapsulation layer 70 includes a first inorganic encapsulation layer 71, a second inorganic encapsulation layer 72, and an organic encapsulation layer 73 disposed between the first inorganic encapsulation layer 71 and the second inorganic encapsulation layer 72. The sequence in which the first inorganic encapsulation layer 71, the second inorganic encapsulation layer 72, and the organic encapsulation layer 73 are stacked may be changed, and the numbers of inorganic encapsulation layers and organic encapsulation layers may be changed. The specific structure of the encapsulation layer is not limited in the embodiments of the present disclosure.

The inorganic encapsulation layer may include at least one inorganic insulating material of aluminium oxide, titanium oxide, tantalum oxide, hafnium oxide, zinc oxide, silicon oxide, silicon nitride, or silicon oxynitride, and may be formed through chemical vapor deposition (CVD) or the like. The organic encapsulation layer may include a polymer-based material which for example, may include an acrylic resin, an epoxy resin, polyimide, polyethylene, and the like.

It is to be noted that in the preceding embodiments, the first groove 30 is exemplarily disposed in the transition region BB, so that the common light-emitting functional layer 50 located on the side of the first cover layer 40 facing away from the base substrate 10 is disconnected from the common light-emitting functional layer 50 located at the bottom of the first groove 30, thereby preventing the common light-emitting functional layer 50 in the display region CC from being eroded by external water vapor through the opening region AA and preventing an impact on the display of the display panel. Further, the first cover layer 40 disposed in the transition region BB may be multiplexed as an electrostatic discharge layer of the display panel, thereby achieving electrostatic discharge in the display region of the display panel, and the first cover layer 40 may be electrically connected to a low-potential signal terminal.

Figure 13:
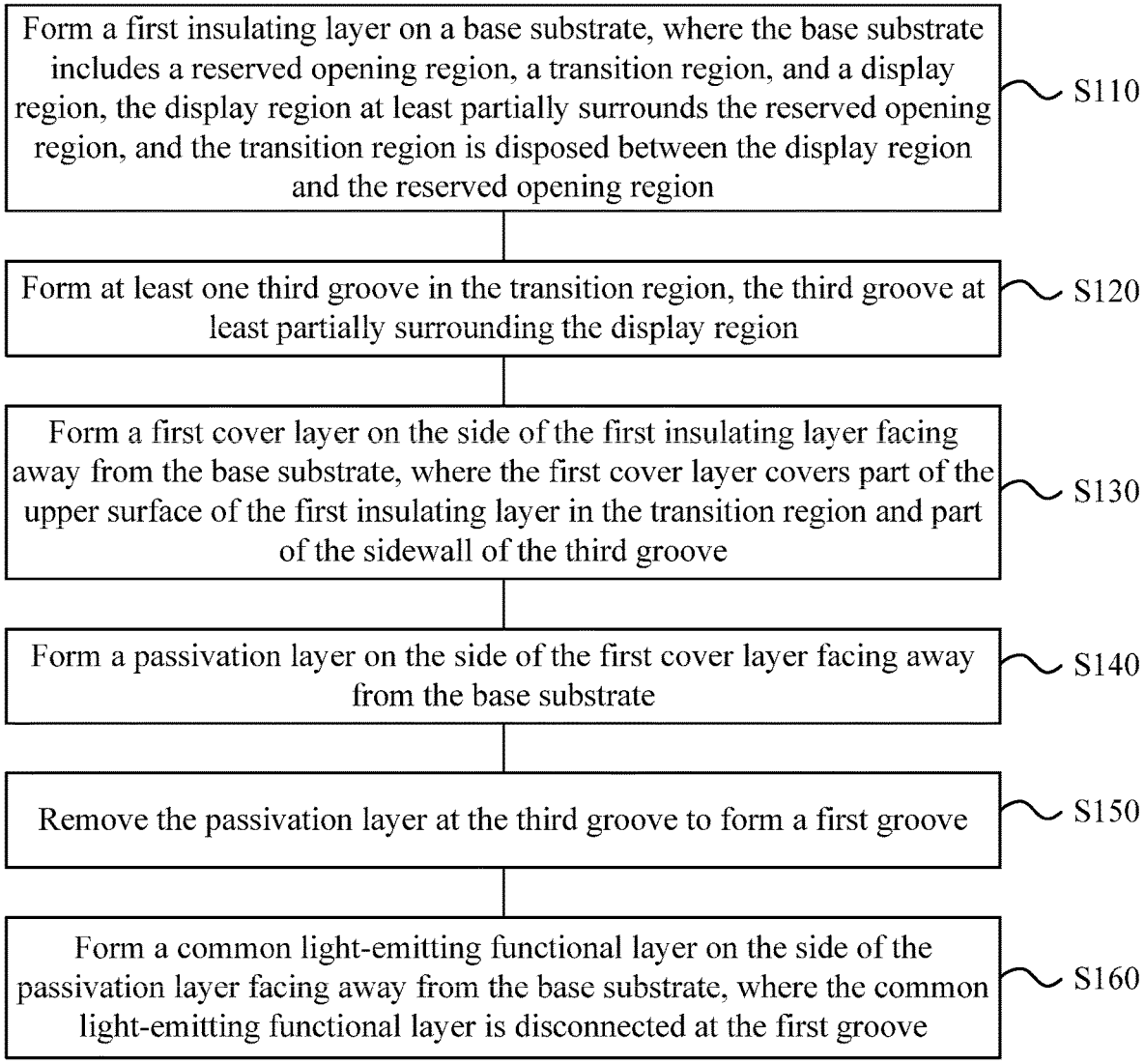
FIG. 13 is a flowchart of a method for manufacturing a display panel according to an embodiment of the present disclosure.

In an embodiment, on the basis of the preceding embodiments, FIG. 13 is a flowchart of a method for manufacturing a display panel according to an embodiment of the present disclosure. As shown in FIG. 13, the manufacturing method includes steps described below.

In step S110, a first insulating layer is formed on a base substrate, where the base substrate includes a reserved opening region, a transition region, and a display region, the display region at least partially surrounds the reserved opening region, and the transition region is disposed between the display region and the reserved opening region.

Firstly, an insulating layer 20 is formed on the base substrate in a manner of deposition.

In step S120, at least one third groove is formed in the transition region, the third groove at least partially surrounding the display region.

Figure 14:
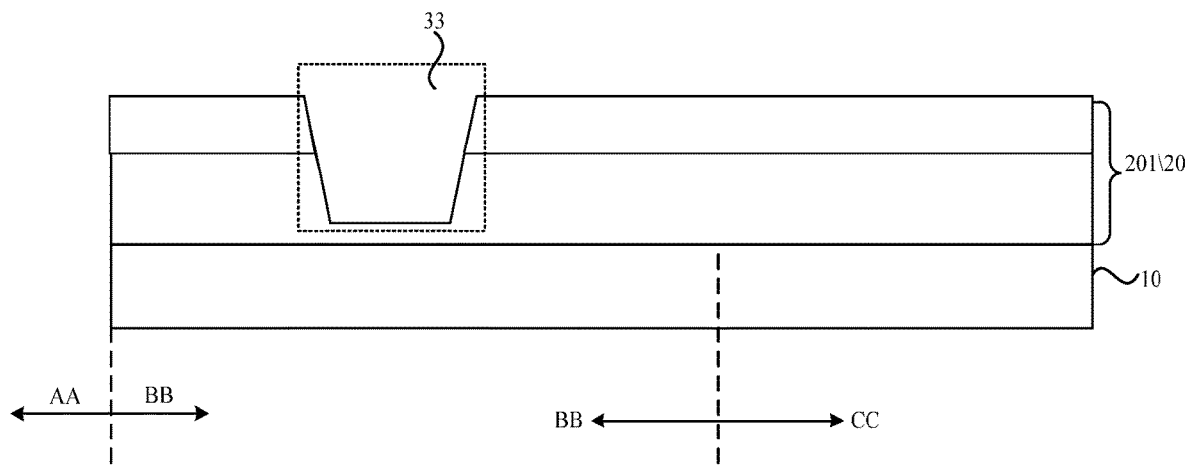
FIG. 14 is a sectional view in a process for manufacturing a display panel according to an embodiment of the present disclosure.

Exemplarily, as shown in FIG. 14, after a first insulating layer 201 is formed on a base substrate 10, the insulating layer 20 disposed in a transition region BB is etched so that at least one third groove 33 is formed in the transition region BB.

In step S130, a first cover layer is formed on a side of the first insulating layer facing away from the base substrate, where the first cover layer covers part of the upper surface of the first insulating layer in the transition region and part of the sidewall of the third groove.

Figure 15:
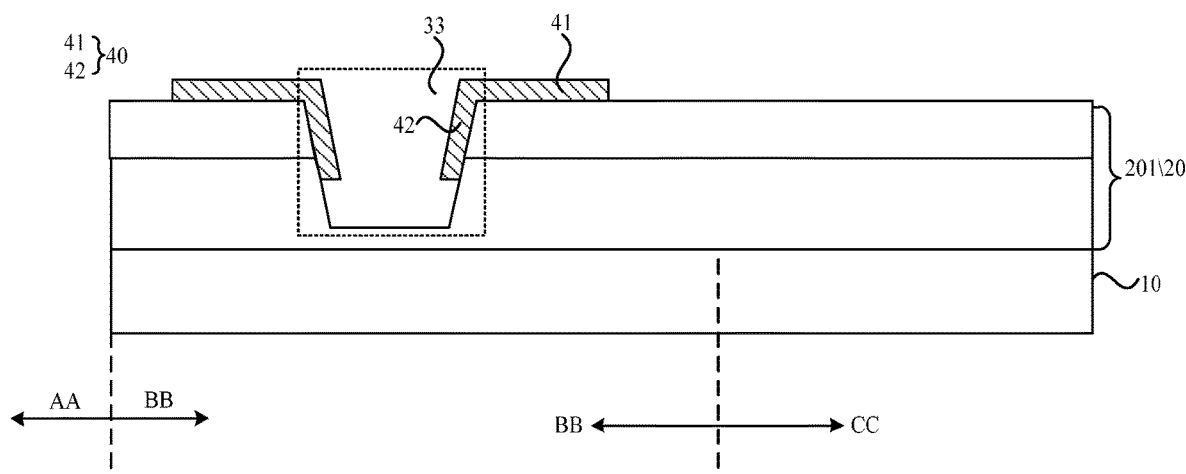
FIG. 15 is a sectional view in another process for manufacturing a display panel according to an embodiment of the present disclosure.

As shown in FIG. 15, after the third groove 33 is formed, a first cover layer 40 is formed on a side of the first insulating layer 201 facing away from the base substrate 10. After the first cover layer 40 is formed, a photoresist layer is coated on the side of the first cover layer facing away from the base substrate. The photoresist layer is exposed and developed so that the corresponding part of photoresist at the bottom of the third groove is removed, and then the first cover layer located in the third groove is removed by the etching process. Therefore, the first cover layer 40 covers part of the upper surface of the first insulating layer 201 in the transition region BB and part of the sidewalls of the third groove 33.

In step S140, a passivation layer is formed on the side of the first cover layer facing away from the base substrate.

In step S150, the passivation layer at the third groove is removed to form a first groove.

As shown in FIG. 16, part of a passivation layer 80 is located on the bottom surface of the third groove 33 when the passivation layer 80 is formed on the side of the first cover layer 40 facing away from the base substrate 10, so when the passivation layer 80 located at the third groove 33 is removed by the etching process, the side surfaces of the third groove not covered by the first cover layer 40 are over-etched by an over-etching process to form a first groove 30.

In a direction perpendicular to and away from the base substrate 10, the first groove 30 includes a first portion 31 and a second portion 32 which are in communication with each other. The first groove 30 penetrates at least part of the first insulating layer 201 and has the second portion 32 disposed on a side of the first portion 31 facing away from the base substrate 10. The aperture X1 of the second portion 32 on the side adjacent to the first portion 31 is less than the aperture X2 of the first portion 31 on the side adjacent to the second portion 32. The first cover layer 40 includes a first sub-cover layer 41 and a second sub-cover layer 42, the first sub-cover layer 41 is disposed on the side of the insulating layer 20 facing away from the base substrate 10, and the second sub-cover layer 42 covers the sidewalls of the second portion 32.

In step S160, a common light-emitting functional layer is formed on a side of the passivation layer facing away from the base substrate, where the common light-emitting functional layer is disconnected at the first groove.

As shown in FIG. 17, when a common light-emitting functional layer 50 is formed on the side of the passivation layer 80 facing away from the base substrate 10 and when the common light-emitting functional layer 50 is formed by evaporation, part of the material of the common light-emitting functional layer 50 is formed by evaporation on the first sub-cover layer 41 of the first cover layer 40, part of the material of the common light-emitting functional layer 50 falls into the bottom of the first groove 30 and no common light-emitting functional layer 50 formed by evaporation exists on the sidewalls of the first groove 30 since the aperture X1 of the second portion 32 of the first groove 30 on the side adjacent to the first portion 31 is less than the aperture X2 of the first portion 31 of the first groove 30 on the side adjacent to the second portion 32 and the thickness of the common light-emitting functional layer 50 is limited. Therefore, the common light-emitting functional layer 50 located on the side of the first sub-cover layer facing away from the base substrate is disconnected from the common light-emitting functional layer 50 located at the bottom of the first groove 30. Thus, the common light-emitting functional layer 50 is discontinuous in the transition region BB. That is, the common light-emitting functional layer 50 is discontinuous in the opening region AA and the display region CC, thus effectively preventing the common light-emitting functional layer 50 in the display region CC from being eroded by external water and oxygen through the opening region AA and thus improving the reliability of a product.

In an embodiment, the aperture of the second portion of the first groove gradually increases along a direction away from the base substrate.

As shown in FIG. 17, the aperture of the second portion 32 of the first groove gradually increases along the direction away from the base substrate 10, so it is ensured that when the first cover layer 40 is formed on the side of the insulating layer 20 facing away from the base substrate 10 by the sputtering process, the second sub-cover layer 42 of the first cover layer 40 can be formed on the sidewalls of the second portion 32 of the first groove 30. Therefore, the sidewalls of the second portion 32 of the first groove 30 covered by the second sub-cover layer 42 cannot be etched, while the sidewalls of the first portion 31 of the first groove 30 not covered by the second sub-cover layer 42 can be further etched. Thus, it is achieved that the aperture X1 of the second portion 32 of the first groove 30 on the side adjacent to the first portion 31 is less than the aperture X2 of the first portion 31 of the first groove 30 on the side adjacent to the second portion 32.

In an embodiment, on the basis of the preceding embodiments, FIG. 18 is a flowchart of another method for manufacturing a display panel according to an embodiment of the present disclosure. As shown in FIG. 18, after at least one third groove is formed in the transition region, the third groove at least partially surrounding the display region, the method further includes steps described below.

In step S210, a second cover layer is formed at the bottom of the third groove.

In step S220, a second insulating layer is formed on the side of the first insulating layer facing away from the base substrate.

In step S230, the second insulating layer at the third groove is removed to form a second groove.

Figure 19:
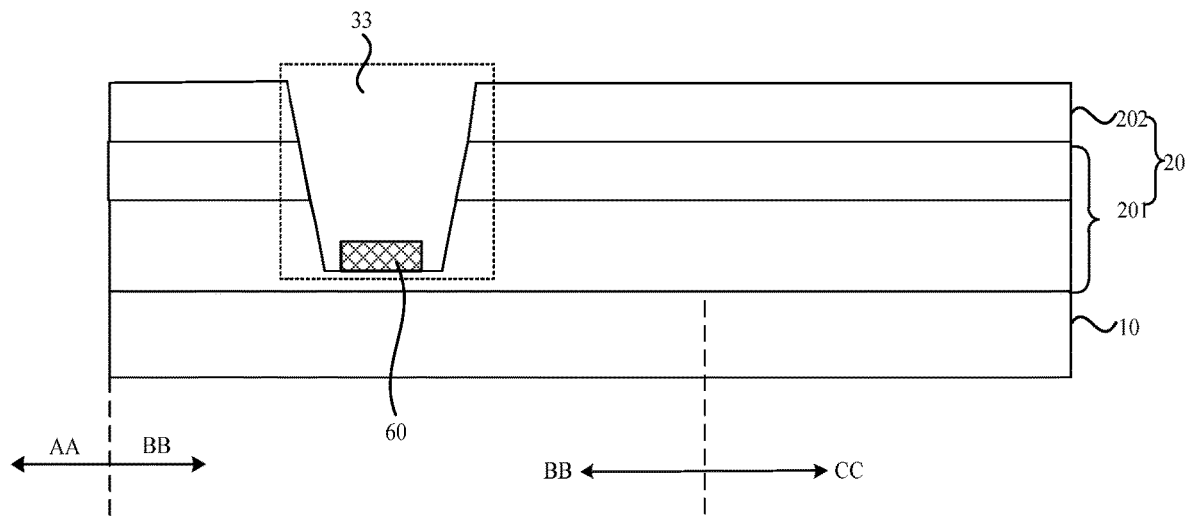
FIG. 19 is a sectional view in another process for manufacturing a display panel according to an embodiment of the present disclosure.

Exemplarily, as shown in FIG. 19, after the third groove 33 is formed in the transition region, the second cover layer 60 is formed at the bottom of the third groove 33 so that subsequently when the common light-emitting functional layer 50 is formed, the material of the common light-emitting functional layer 50 falling into the bottom of the third groove 33 is formed on the second cover layer 60. Since a height difference exists between the common light-emitting functional layer formed on the second cover layer and the bottom of the third groove 33, the common light-emitting functional layer formed on the second cover layer is disconnected from the common light-emitting functional layer located at the bottom of the third groove, further preventing the common light-emitting functional layer in the display region from being eroded by external water and oxygen through the opening region. When the second insulating layer is formed on the side of the first insulating layer facing away from the base substrate after the second cover layer is formed at the bottom of the third groove 33, part of the second insulating layer is located on the bottom surface of the third groove 33, and the second insulating layer located at the third groove 33 is removed by the etching process to form the second groove.

In an embodiment, over-etching processing is performed on the second insulating layer at the third groove to form the second groove, where the distance between the bottom of the second groove at a position with the second cover layer disposed and the surface of the side of the base substrate facing away from the insulating layer is H1, the distance between the bottom of the second groove at a position with no second cover layer disposed and the surface of the side of the base substrate facing away from the insulating layer is H2, and H1≥H2.

Figure 20:
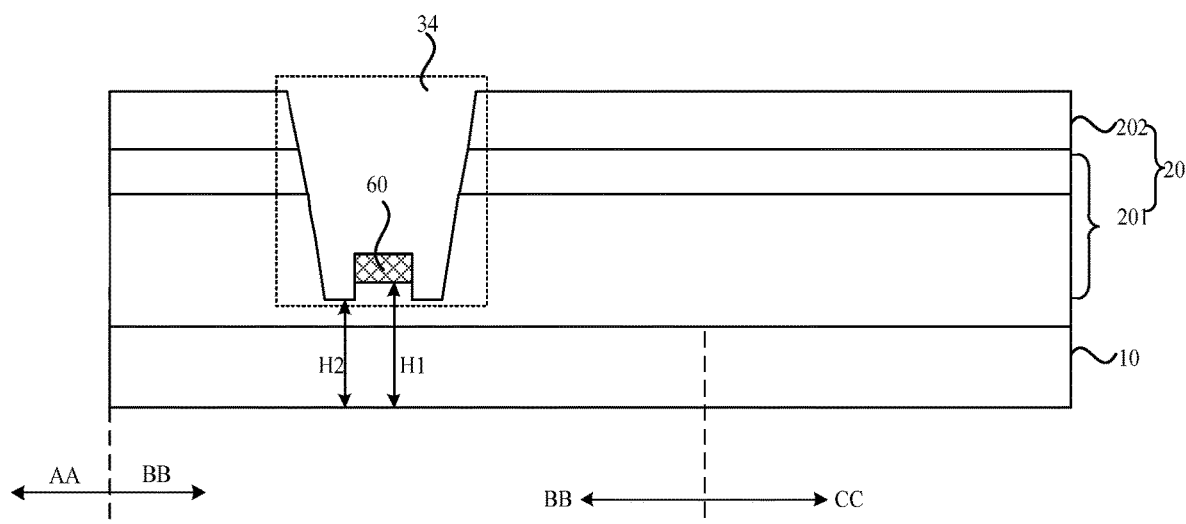
FIG. 20 is a sectional view in another process for manufacturing a display panel according to an embodiment of the present disclosure.

Exemplarily, as shown in FIG. 20, when the second insulating layer is formed on the side of the first insulating layer facing away from the base substrate, part of the second insulating layer falls into the third groove. The over-etching processing is performed on the second insulating layer in the third groove so that the distance between the bottom of the second groove with no second cover layer disposed and the surface of the side of the base substrate facing away from the insulating layer is less than or equal to the distance between the bottom of the second groove at the position with the second cover layer disposed and the surface of the side of the base substrate facing away from the insulating layer. Thus, the distance from the common light-emitting functional layer 50 formed on the second cover layer 60 to the bottom of the second groove 34 is increased, further ensuring that the common light-emitting functional layer 50 is disconnected in the groove.

Figure 21:
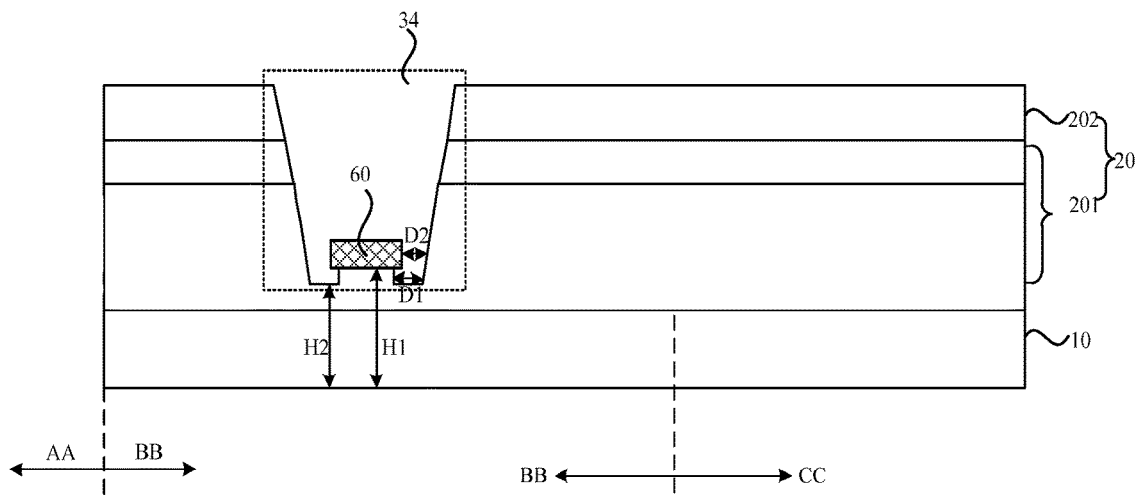
FIG. 21 is a sectional view in another process for manufacturing a display panel according to an embodiment of the present disclosure.

It is to be noted that FIG. 20 exemplarily illustrates that the over-etching processing is performed on the second insulating layer at the third groove. In other implementations, the first insulating layer 201 at the position with the second cover layer disposed may be subjected to side-etching processing while the second insulating layer in the third groove is subjected to etching processing. As shown in FIG. 21, the distance between the sidewall of the second cover layer and the sidewall of the third groove is D2, the distance between the sidewall of the first insulating layer located in the third groove and the sidewall of the second groove is D1, and D1>D2. The second cover layer is formed on the side of the second insulating layer facing away from the base substrate, so that the first insulating layer in the second groove is side-etched, further ensuring that the common light-emitting functional layer formed on the second cover layer is completely disconnected from the common light-emitting functional layer located at the bottom of the second groove.

In an embodiment, the step in which the first cover layer is formed on the side of the first insulating layer facing away from the base substrate further includes that the second cover layer is formed at the bottom of the third groove.

Figure 22:
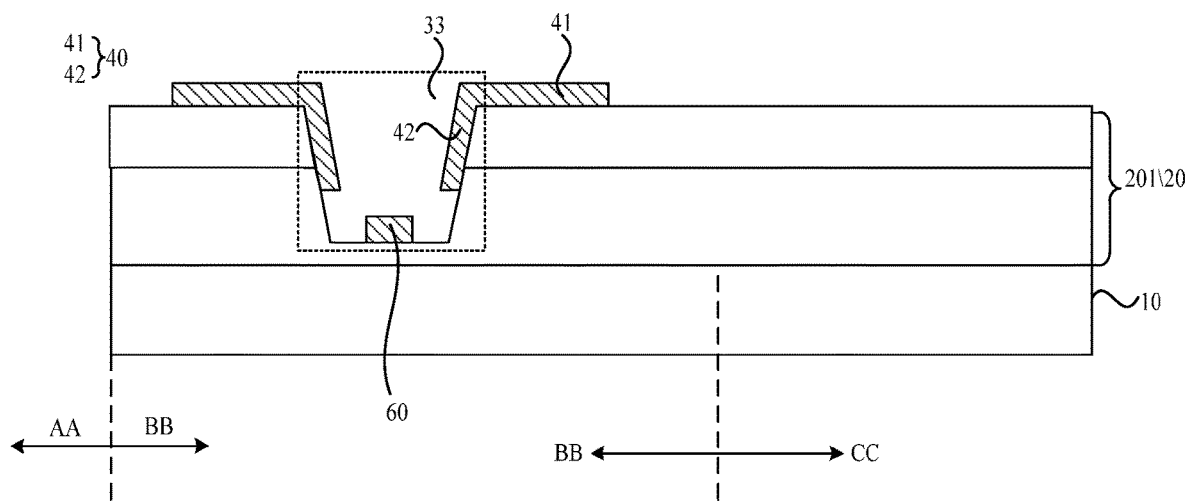
FIG. 22 is a sectional view in another process for manufacturing a display panel according to an embodiment of the present disclosure.

Exemplarily, as shown in FIG. 22, when the first cover layer 40 is formed by the sputtering process, the second cover layer 60 is also formed at the bottom of the third groove 33 by the sputtering process. The first cover layer 40 and the second cover layer 60 are disposed at the same layer, so that the first cover layer 40 and the second cover layer 60 can be formed in the same process, thus reducing the complexity of the manufacturing process for the display panel.

In an embodiment, after the first cover layer is formed on the side of the first insulating layer facing away from the base substrate, the method further includes that the second cover layer is formed at the bottom of the third groove.

Exemplarily, as shown in FIG. 11, a first metal layer 240 is further provided in the display region CC of the display panel and is disposed on a side of a source and drain metal layer 230 facing away from the base substrate 10, where the first metal layer 240 is electrically connected to an anode metal layer 250 of an organic light-emitting element so as to reduce the anode resistance of the organic light-emitting element. Therefore, the second cover layer 60 may be formed in the transition region of the display panel while the first metal layer 240 in the display region of the display panel is manufactured. That is, after the first cover layer is formed on the side of the first insulating layer facing away from the base substrate, the method further includes that the second cover layer is formed at the bottom of the third groove, thereby reducing the process complexity of the display panel and improving the manufacturing efficiency.

In an embodiment, after the second cover layer 60 is formed at the bottom of the third groove, the method further includes that a gate layer 220 of a thin-film transistor T is formed in the display region CC.

In an embodiment, the step in which the first cover layer 40 is formed on the side of the first insulating layer 201 facing away from the base substrate 10 further includes that the source or drain layer 230 of the thin-film transistor T is formed in the display region CC.

Optionally, the thin-film transistor T in the display region is of a top-gate structure; the first insulating layer 201 includes a buffer layer 21 and a first interlayer insulating layer 22, and the second insulating layer 202 includes a second interlayer insulating layer 23; the buffer layer 21 is disposed between an active layer 210 of the thin-film transistor T and the base substrate 10, the first interlayer insulating layer 22 is disposed between the gate layer 220 of the thin-film transistor T and the active layer 210 of the thin-film transistor T, and the second interlayer insulating layer 23 is disposed between the gate layer 220 of the thin-film transistor T and the source or drain layer 230 of the thin-film transistor T.

Figure 23:
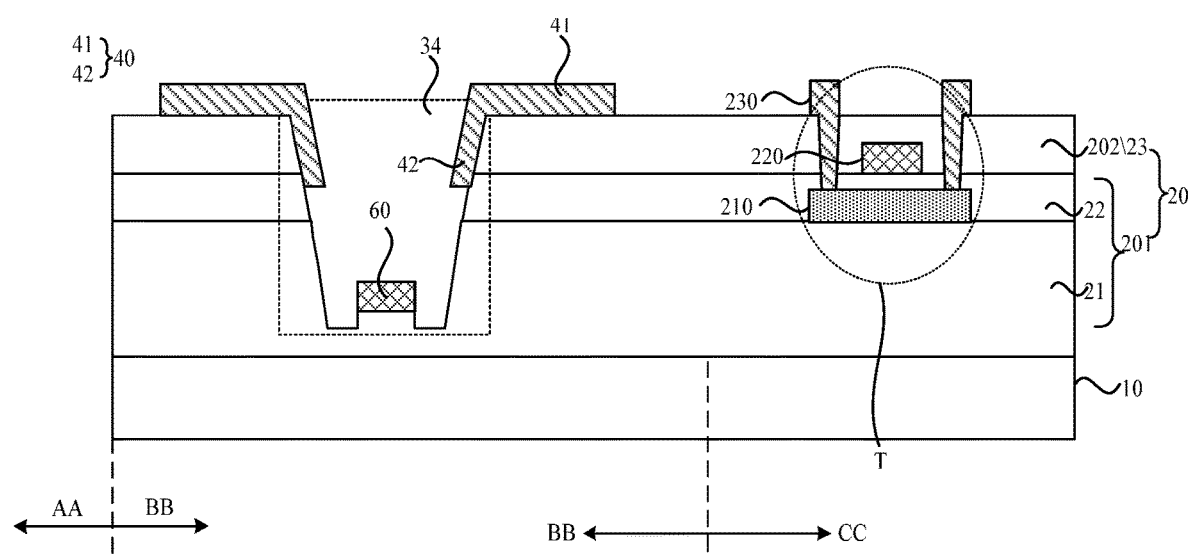
FIG. 23 is a sectional view in another process for manufacturing a display panel according to an embodiment of the present disclosure.
Figure 24:
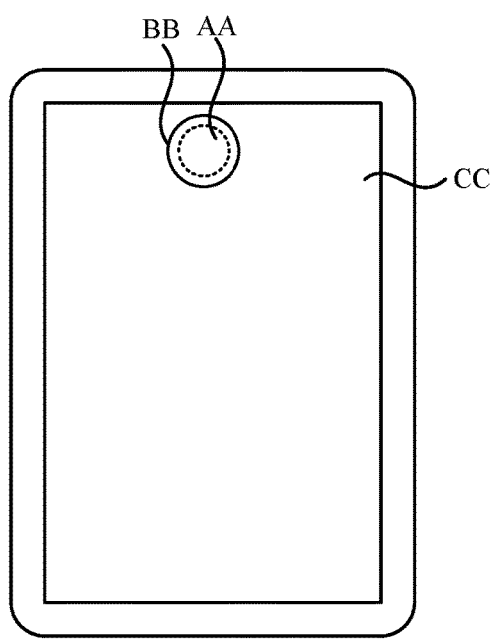
FIG. 24 is a structural diagram of a display device according to an embodiment of the present disclosure.

Exemplarily, as shown in FIG. 23, the second cover layer 60 may be formed in the transition region BB while the gate layer 220 in the display region is formed, and the first cover layer 40 may be formed in the transition region BB while the source or drain layer 230 in the display region is formed, thereby reducing the process complexity of the display panel and improving the manufacturing efficiency.

When the thin-film transistor T in the display region CC is of the top-gate structure, the insulating layer 20 includes the first insulating layer 201 and the second insulating layer 202, the first insulating layer 201 includes the buffer layer 21 and the first interlayer insulating layer 22, the second insulating layer 202 includes the second interlayer insulating layer 23, and the buffer layer 21 is disposed between the active layer 210 of the thin-film transistor T and the base substrate 10. The buffer layer 21 is used for preventing impurities from penetrating into the thin-film transistor T, may include an inorganic insulating material such as silicon nitride or silicon oxide, and may have a single layer or a plurality of layers including the inorganic insulating material. The first interlayer insulating layer 22 is disposed between the gate layer 220 of the thin-film transistor T and the active layer 210 of the thin-film transistor T, and the gate of the thin-film transistor T and the active layer 210 of the thin-film transistor T can be insulated from each other by the first interlayer insulating layer 22. The second interlayer insulating layer 23 is disposed between the gate layer 220 of the thin-film transistor T and the source or drain layer 230 of the thin-film transistor T, and the gate of the thin-film transistor T and the source and drain of the thin-film transistor T can be insulated from each other by the second interlayer insulating layer 23.

In an embodiment, on the basis of the preceding embodiments, a display device is further provided in an embodiment of the present disclosure. The display device includes the display panel provided in the embodiments of the present disclosure, so the display device also has the beneficial effects of the display panel provided in the embodiments of the present disclosure, and the same portions can be understood with reference to the above description and are not described in detail below.

It is to be noted that the display device provided in the embodiment of the present disclosure may be a mobile phone, a tablet computer, a smart wearable device (such as a smart watch) and another display device having fingerprint identification functions and known to those skilled in the art, and is not limited in the embodiments of the present disclosure.

It is to be noted that the preceding are only embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
    an opening region, a transition region, and a display region, wherein the display region at least partially surrounds the opening region, and the transition region is disposed between the display region and the opening region;
    a base substrate;
    an insulating layer disposed on the base substrate;
    a first groove provided in the transition region, wherein the first groove at least partially surrounds the display region; in a direction perpendicular to and away from the base substrate, the first groove comprises a first portion and a second portion which are in communication with each other; and the first groove penetrates at least part of the insulating layer and has the second portion disposed on a side of the first portion away from the base substrate, and an aperture of the second portion on a side adjacent to the first portion is less than an aperture of the first portion on a side adjacent to the second portion;
    a first cover layer, wherein the first cover layer comprises a first sub-cover layer and a second sub-cover layer, the first sub-cover layer is disposed on a side of the insulating layer facing away from the base substrate, and the second sub-cover layer covers a sidewall of the second portion; and
    a common light-emitting functional layer, wherein the common light-emitting functional layer is disposed on a side of the first cover layer facing away from the base substrate and is disconnected at the first groove;
    wherein a side wall of the second portion of the first groove comprises a slope surface, and an aperture of the second portion of the first groove on a side away from the first portion is greater than an aperture of the second portion of the first groove on a side adjacent to the first portion.

2. The display panel of claim 1, further comprising: a second cover layer disposed at a bottom of the first groove.

3. The display panel of claim 2, further comprising: a protrusion structure disposed at the bottom of the first groove, wherein at least part of the protrusion structure is covered by the second cover layer.

4. The display panel of claim 1, wherein at least part of the first groove is disposed at the base substrate, and a depth of the first groove is less than a sum of a thickness of the insulating layer and a thickness of the base substrate.

5. The display panel of claim 2, wherein the first cover layer and the second cover layer are disposed at a same layer.

6. The display panel of claim 2, wherein the first cover layer and the second cover layer are disposed at different layers; and
    the first cover layer is disposed at a same layer as a source or drain layer of a thin-film transistor in the display region, and the second cover layer is disposed at a same layer as a gate layer of the thin-film transistor in the display region; or
    the first cover layer is disposed at a same layer as a source or drain layer of a thin-film transistor in the display region, the second cover layer is disposed at a same layer as a first metal layer in the display region, and the first metal layer is disposed on a side of the source or drain layer facing away from the base substrate.

7. The display panel of claim 5, wherein the insulating layer comprises a first insulating layer and a second insulating layer, and the thin-film transistor in the display region is of a top-gate structure;
    the first insulating layer comprises a buffer layer and a first interlayer insulating layer, and the second insulating layer comprises a second interlayer insulating layer; and
    the buffer layer is disposed between an active layer of the thin-film transistor and the base substrate, the first interlayer insulating layer is disposed between a gate layer of the thin-film transistor and the active layer of the thin-film transistor, and the second interlayer insulating layer is disposed between the gate layer of the thin-film transistor and the source or drain layer of the thin-film transistor.

8. The display panel of claim 1, wherein the transition region of the display panel is further provided with at least one retaining wall structure, and a plurality of first grooves are provided in the transition region of the display panel;
    each of the at least one retaining wall structure at least partially surrounds the opening region;
    at least one of the plurality of first grooves is disposed between the at least one retaining wall structure and the display region; and
    at least one of the plurality of first grooves is disposed between the at least one retaining wall structure and the opening region.

9. The display panel of claim 1, wherein the common light-emitting functional layer comprises at least one of: a hole auxiliary layer, an electron auxiliary layer, a light-emitting material layer, or a cathode layer.

10. The display panel of claim 1, further comprising: an encapsulation layer, wherein the encapsulation layer is disposed on a side of the common light-emitting functional layer facing away from the base substrate and fills the first groove; and
    the encapsulation layer comprises at least one inorganic encapsulation layer and at least one organic encapsulation layer.

11. A method for manufacturing the display panel of claim 1, comprising:
    forming a first insulating layer on the base substrate, wherein the base substrate comprises a reserved opening region, the transition region, and the display region, the display region at least partially surrounds the reserved opening region, and the transition region is disposed between the display region and the reserved opening region;
    forming at least one third groove in the transition region, each of the at least one third groove at least partially surrounding the display region;

forming the first cover layer on a side of the first insulating layer facing away from the base substrate, wherein the first cover layer covers part of an upper surface of the first insulating layer in the transition region and part of a sidewall of each of the at least one third groove;

forming a passivation layer on a side of the first cover layer facing away from the base substrate;

removing the passivation layer at each of the at least one third groove to form the first groove, wherein in the direction perpendicular to and away from the base substrate, the first groove comprises the first portion and the second portion which are in communication with each other; the first groove penetrates at least part of the first insulating layer and has the second portion disposed on the side of the first portion away from the base substrate, and the aperture of the second portion on the side adjacent to the first portion is less than the aperture of the first portion on the side adjacent to the second portion; and the first cover layer comprises the first sub-cover layer and the second sub-cover layer, the first sub-cover layer is disposed on the side of the first insulating layer facing away from the base substrate, and the second sub-cover layer covers the sidewall of the second portion; and forming the common light-emitting functional layer on the side of the passivation layer facing away from the base substrate, wherein the common light-emitting functional layer is disconnected at the first groove.

12. The method of claim 11, wherein an aperture of the second portion of the first groove gradually increases along a direction away from the base substrate.

13. The method of claim 11, after forming the at least one third groove in the transition region, each of the at least one third groove at least partially surrounding the display region, further comprising:

forming a second cover layer at a bottom of each of the at least one third groove;

forming a second insulating layer on the side of the first insulating layer facing away from the base substrate; and removing the second insulating layer at each of the at least one third groove to form a second groove.

14. The method of claim 13, wherein removing the second insulating layer at each of the at least one third groove to form the second groove comprises:

performing over-etching processing on the second insulating layer at each of the at least one third groove to form the second groove;

wherein a distance between a bottom of the second groove at a position with the second cover layer disposed and a surface of a side of the base substrate facing away from an insulating layer is H1, a distance between the bottom of the second groove at a position with no second cover layer disposed and the surface of the side of the base substrate facing away from an insulating layer is H2, and H1≥H2.

15. The method of claim 11, wherein forming the first cover layer on the side of the first insulating layer facing away from the base substrate further comprises:

forming the second cover layer at the bottom of each of the at least one third groove.

16. The method of claim 11, after forming the first cover layer on the side of the first insulating layer facing away from the base substrate, further comprising:

forming the second cover layer at the bottom of each of the at least one third groove.

17. The method of claim 13, wherein forming the second cover layer at the bottom of each of the at least one third groove further comprises:

forming a gate layer of a thin-film transistor in the display region.

18. The method of claim 13, wherein forming the first cover layer on the side of the first insulating layer facing away from the base substrate farther comprises:

forming a source or drain layer of a thin-film transistor in the display region.

19. A display device, comprising a display panel, wherein the display panel comprises:

an opening region, a transition region, and a display region, wherein the display region at least partially surrounds the opening region, and the transition region is disposed between the display region and the opening region;

a base substrate;

an insulating layer disposed on the base substrate;

a first groove provided in the transition region, wherein the first groove at least partially surrounds the display region; in a direction perpendicular to and away from the base substrate, the first groove comprises a first portion and a second portion which are in communication with each other; and the first groove penetrates at least part of the insulating layer and has the second portion disposed on a side of the first portion away from the base substrate, and an aperture of the second portion on a side adjacent to the first portion is less than an aperture of the first portion on a side adjacent to the second portion;

a first cover layer, wherein the first cover layer comprises a first sub-cover layer and a second sub-cover layer, the first sub-cover layer is disposed on a side of the insulating layer facing away from the base substrate, and the second sub-cover layer covers a sidewall of the second portion; and a common light-emitting functional layer, wherein the common light-emitting functional layer is disposed on a side of the first cover layer facing away from the base substrate and is disconnected at the first groove;

wherein a side wall of the second portion of the first groove comprises a slope surface, and an aperture of the second portion of the first groove on a side away from the first portion is greater than an aperture of the second portion of the first groove on a side adjacent to the first portion.

* * * * *